(12) United States Patent
Hirota

(10) Patent No.: US 9,686,462 B2
(45) Date of Patent: Jun. 20, 2017

(54) SOLID-STATE IMAGING DEVICE AND ELECTRONIC APPARATUS

(71) Applicant: Sony Corporation, Tokyo (JP)

(72) Inventor: Isao Hirota, Kanagawa (JP)

(73) Assignee: Sony Corporation, Tokyo (JP)

( * ) Notice: Subject to any disclaimer, the term of this patent is extended or adjusted under 35 U.S.C. 154(b) by 155 days.

(21) Appl. No.: 14/549,300

(22) Filed: Nov. 20, 2014

(65) Prior Publication Data

US 2015/0146056 A1 May 28, 2015

(30) Foreign Application Priority Data

Nov. 27, 2013 (JP) ................................. 2013-244952
Jul. 15, 2014 (JP) ................................. 2014-145101

(51) Int. Cl.

| H04N 5/232 | (2006.01) |
| H04N 5/369 | (2011.01) |
| H04N 13/02 | (2006.01) |
| H04N 9/04 | (2006.01) |
| H04N 5/225 | (2006.01) |
| H04N 9/09 | (2006.01) |

(52) U.S. Cl.
CPC ....... *H04N 5/23212* (2013.01); *H04N 5/2258* (2013.01); *H04N 5/369* (2013.01); *H04N 9/045* (2013.01); *H04N 9/09* (2013.01); *H04N 13/0235* (2013.01); *H04N 13/0271* (2013.01)

(58) Field of Classification Search
CPC .. H04N 5/2253; H04N 5/2254; H04N 5/2258; H04N 5/23212; H04N 5/369–5/378; H04N 9/045–9/083; H04N 9/09–9/097; H01L 27/146–27/14652; G03B 13/32–13/36; G03B 3/00–3/12
See application file for complete search history.

(56) References Cited

U.S. PATENT DOCUMENTS

| 2011/0234884 A1* | 9/2011 | Shintani .............. H04N 5/2258 348/345 |
| 2012/0105696 A1* | 5/2012 | Maeda .............. H01L 21/76898 348/302 |

FOREIGN PATENT DOCUMENTS

| JP | 2000-292685 A | 10/2000 |
| JP | 2001-250931 A | 9/2001 |

* cited by examiner

*Primary Examiner* — Paul Berardesca
(74) *Attorney, Agent, or Firm* — Sheridan Ross P.C.

(57) ABSTRACT

There is provided a solid-state imaging device including two or more photoelectric conversion layers that have photoelectric conversion portions divided on a pixel-by-pixel basis and are laminated. Light, which is incident into a single pixel of a first photoelectric conversion layer close to an optical lens, is received by the photoelectric conversion portions of a plurality of pixels of a second photoelectric conversion layer far from the optical lens.

30 Claims, 42 Drawing Sheets

| RELATIVE SENSITIVITY [%] | G | R | B |
|---|---|---|---|
| UPPER RGB | 19.1 | 11.2 | 16.6 |
| LOWER rab | 2.97 | 2.96 | 0.765 |

| RELATIVE SENSITIVITY [%] | G | R | B |
|---|---|---|---|
| UPPER RGB | 17.1 | 9.62 | 15.8 |
| LOWER rab | 4.85 | 4.26 | 1.41 |

SOLID-STATE IMAGING DEVICE AND ELECTRONIC APPARATUS

CROSS REFERENCE TO RELATED APPLICATIONS

This application claims the benefit of Japanese Priority Patent Application JP 2013-244952 filed Nov. 27, 2013, and Japanese Priority Patent Application JP 2014-145101 filed Jul. 15, 2014, the entire contents of each of which are incorporated herein by reference.

BACKGROUND

The present disclosure relates to a solid-state imaging device and an electronic apparatus. In particular, the present disclosure relates to a solid-state imaging device and an electronic apparatus capable of performing focus control at a high speed.

As general autofocus methods provided to imaging apparatuses and the like, there are two methods of a contrast method and a phase difference method. In the contrast method, by detecting contrast change while shifting a position of a focus lens, the contrast is adjusted to be maximized. In the phase difference method, by using a phase difference sensor different from an image sensor, the position of the focus lens is set once in accordance with a distance measurement result based on a triangulation method.

In the contrast method, detection is performed on the basis of an image itself, and thus it is possible to precisely adjust focus. However, a direction of the focus is not certain unless a plurality of images is captured, and thus it takes time to perform convergence. In contrast, in the phase difference method, the position of the focus lens is set once, and thus focus adjustment is performed at a high speed. However, an image is formed on the phase difference sensors by sub mirrors in the middle of the lens, and thus deviation may occur and a focus ratio may not reach 100%.

Hence, in recent years, an image plane phase difference sensor, in which phase difference pixels are provided on a part of the image sensor, and the like has been developed (for example, refer to Japanese Unexamined Patent Application Publication Nos. 2001-250931 and 2000-292685).

SUMMARY

However, in the image plane phase difference sensor, a spatial sampling frequency is low, and thus precision is not ensured near the point of focus. Accordingly, as a result, the sensor serves as a hybrid type, in which the contrast method is used in combination, near the point of focus, and thus the focus speed thereof is not sufficiently high.

According to the present disclosure, it is desirable to perform focus control at a high speed.

According to a first embodiment of the present disclosure, there is provided a solid-state imaging device including two or more photoelectric conversion layers that have photoelectric conversion portions divided on a pixel-by-pixel basis and are laminated, in which light, which is incident into a single pixel of a first photoelectric conversion layer close to an optical lens, is received by the photoelectric conversion portions of a plurality of pixels of a second photoelectric conversion layer far from the optical lens.

According to a second embodiment of the present disclosure, there is provided an electronic apparatus including a solid-state imaging device in which two or more photoelectric conversion layers having photoelectric conversion portions divided on a pixel-by-pixel basis are laminated, in which light, which is incident into a single pixel of a first photoelectric conversion layer close to an optical lens, is received by the photoelectric conversion portions of a plurality of pixels of a second photoelectric conversion layer far from the optical lens.

In the first and second embodiments of the present disclosure, the two or more photoelectric conversion layers having the photoelectric conversion portions divided on a pixel-by-pixel basis are laminated, and the light, which is incident into a single pixel of the first photoelectric conversion layer close to the optical lens, is received by the photoelectric conversion portions of the plurality of pixels of the second photoelectric conversion layer far from the optical lens.

According to a third embodiment of the present disclosure, there is provided a solid-state imaging device including: a semiconductor substrate that has a signal processing circuit formed thereon and is laminated; and a photoelectric conversion layer that has photoelectric conversion portions divided on a pixel-by-pixel basis and is laminated, in which the semiconductor substrate has a transmission pixel which corresponds to a single pixel of the photoelectric conversion layer and transmits light to the photoelectric conversion layer, and in which the light, which is incident into the transmission pixel of the semiconductor substrate, is received by the photoelectric conversion portions of a plurality of pixels of the photoelectric conversion layer, and focus control is performed by using a phase difference which is obtained by the plurality of pixels of the photoelectric conversion layer.

In the third embodiment of the present disclosure, the semiconductor substrate having the signal processing circuit formed thereon and the photoelectric conversion layer having the photoelectric conversion portions divided on a pixel-by-pixel basis is laminated, the semiconductor substrate has the transmission pixel which corresponds to a single pixel of the photoelectric conversion layer and transmits the light to the photoelectric conversion layer, the light, which is incident into the transmission pixel of the semiconductor substrate, is received by the photoelectric conversion portions of the plurality of pixels of the photoelectric conversion layer, and the focus control is performed by using the phase difference which is obtained by the plurality of pixels of the photoelectric conversion layer.

The solid-state imaging device and the electronic apparatus may be applied to a separate apparatus, and may be applied to modules installed in different apparatuses.

According to the first to third embodiments of the present disclosure, it is possible to perform focus control at a high speed.

It should be noted that the effect described herein is not necessarily limited, and may be any one of the effects described in the present disclosure.

DETAILED DESCRIPTION OF EMBODIMENTS

Hereinafter, modes for carrying out the present disclosure (hereinafter referred to as embodiments) will be described. Description will be given in the following order:

1. First Embodiment (a first configuration example in which a contrast difference is detected by upper and lower substrates);
2. Second Embodiment (a second configuration example in which a contrast difference is detected by upper and lower substrates);
3. Third Embodiment (a configuration example in which a phase difference is detected by a lower substrate);
4. Fourth Embodiment (a configuration example in which an upper substrate is formed as a thin film); and
5. Application Example of Electronic Apparatus.

1. First Embodiment of Solid-State Imaging Device
Configuration of Imaging Mechanism FIG. 1 is a diagram illustrating an imaging mechanism that includes a solid-state imaging device according to an embodiment of the present disclosure.

Figure 1:
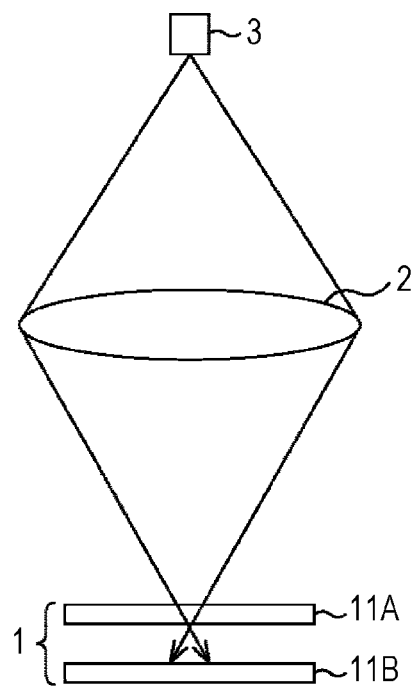
FIG. 1 is a diagram illustrating an imaging mechanism that includes a solid-state imaging device according to an embodiment of the present disclosure.

A solid-state imaging device 1 according to an embodiment of the present disclosure receives light of an object 3 which is concentrated through an optical lens 2, as shown in FIG. 1.

The solid-state imaging device 1 is, for example, a combination-type solid-state imaging device in which two semiconductor substrates 11A and 11B are laminated. A photoelectric conversion layer, which has photoelectric conversion portions divided on a pixel-by-pixel basis, is formed on each of the semiconductor substrates 11A and 11B. The semiconductors of the semiconductor substrates 11A and 11B are, for example, silicon (Si).

It should be noted that, hereinafter, of the two semiconductor substrates 11A and 11B, the semiconductor substrate 11A close to the optical lens 2 is referred to as an upper side substrate 11A, and the semiconductor substrate 11B far from the optical lens 2 is referred to as a lower side substrate 11B. Further, if the two semiconductor substrates 11A and 11B are not particularly distinguished, the substrates are simply referred to as substrates 11.

Figure 2:
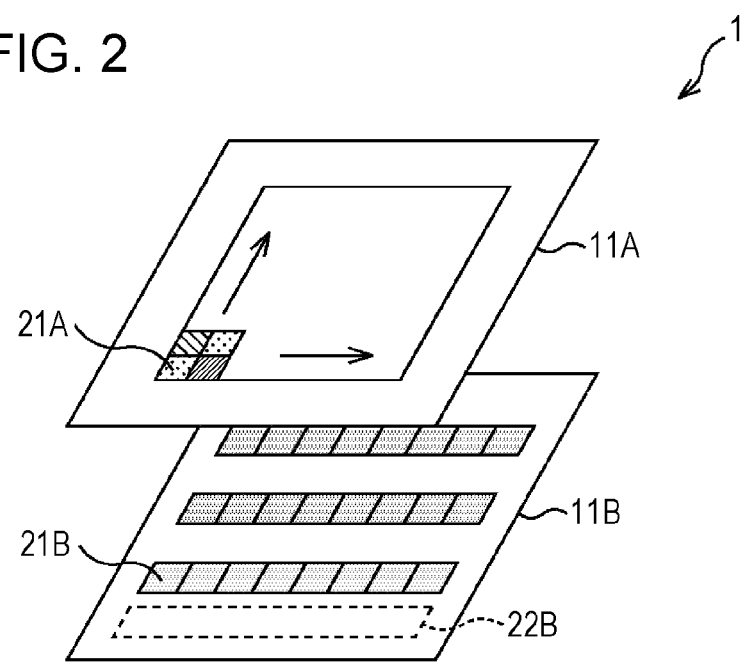
FIG. 2 is a diagram illustrating a schematic configuration of an upper side substrate and a lower side substrate.

FIG. 2 is a diagram illustrating a schematic configuration of the upper side substrate 11A and the lower side substrate 11B of the solid-state imaging device 1.

A plurality of pixels 21A, in which color filters of red (R), green (G), and blue (B) are formed, is arranged on the upper side substrate 11A in a two-dimensional array shape.

A plurality of pixels 21B is formed on the lower side substrate 11B in a shape which corresponds to only some of a plurality of pixel rows formed on the upper side substrate 11A. In a region in which the pixels 21B of the lower side substrate 11B are not formed, a logic circuit 22B is formed, which includes a signal processing circuit that processes signals detected by the pixels 21A of the upper side substrate 11A and the pixels 21B of the lower side substrate 11B.

Figure 3:
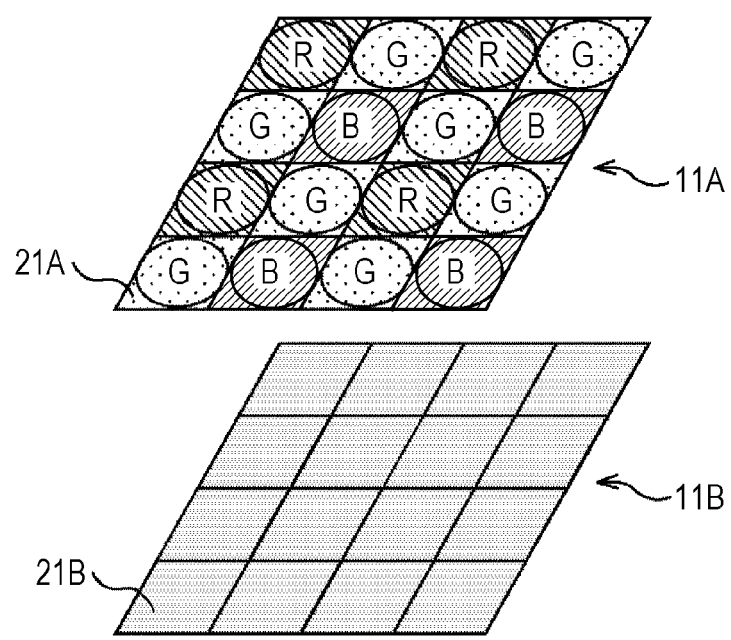
FIG. 3 is a diagram illustrating a schematic configuration of the upper side substrate and the lower side substrate.

As shown in FIG. 3, the color filters formed on the pixels 21A of the upper side substrate 11A are arranged in, for example, a Bayer array. Accordingly, the upper side substrate 11A may function as a color image sensor that outputs R, G, and B color signals.

It should be noted that a color array of the color filters is not limited to the Bayer array, and may employ another array method. Hereinafter, the pixel 21A, in which an R color filter is formed on the upper side substrate 11A, is referred to as an R pixel, the pixel 21A, in which a G color filter is formed, is referred to as a G pixel, and the pixel 21A, in which a B color filter is formed, is referred to as a B pixel.

In the region in which the pixels 21B of the lower side substrate 11B are formed, for example, each pixel 21B is formed with a pixel size the same as that of the pixel 21A of the upper side substrate 11A at a position corresponding to the position of the pixel 21A of the upper side substrate 11A. Light, in which R, G, and B light passing through the upper side substrate 11A is scattered (mixed), is incident on each pixel 21B of the lower side substrate 11B. Consequently, the lower side substrate 11B also functions as a monochrome image sensor that outputs a monochrome signal in which R, G, and B are mixed.

The solid-state imaging device 1 configured in such a manner calculates a contrast difference between an image (signal), which is obtained by the pixels 21A of the upper side substrate 11A, and an image (signal) which is obtained by the pixels 21B of the lower side substrate 11B, and performs focus control on the basis of the calculation result.

Focus Control of Contrast Method

Figure 4:
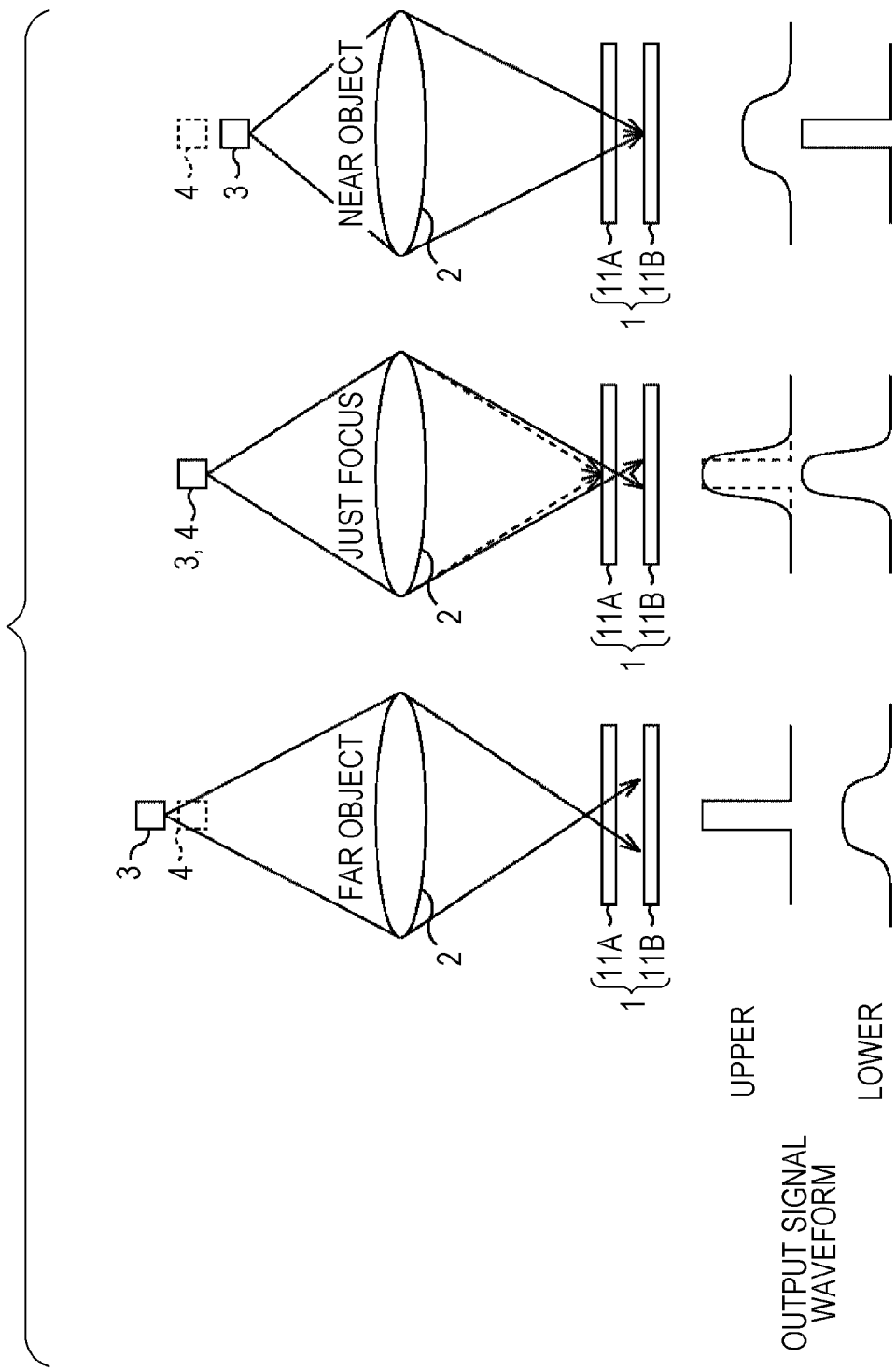
FIG. 4 is a diagram illustrating focus control of a contrast method.

FIG. 4 is a diagram illustrating focus control of a contrast method which is performed by the solid-state imaging device 1.

In a far object state shown on the left side of FIG. 4, that is, a state where the object 3 is farther away than a focus position 4, a contrast of the image, which is obtained by the upper side substrate 11A, is higher than a contrast of the image which is obtained by the lower side substrate 11B.

Conversely, in a near object state shown on the right side of FIG. 4, that is, a state where the object 3 is closer than the focus position 4, the contrast of the image, which is obtained by the lower side substrate 11B, is higher than the contrast of the image which is obtained by the upper side substrate 11A.

In addition, in a just focus state shown in the middle of FIG. 4, that is, a state where the position of the object 3 coincides with the focus position 4, the contrast of the image, which is obtained by the upper side substrate 11A, coincides with the contrast of the image which is obtained by the lower side substrate 11B. It should be noted that a state of the dashed line shown in the just focus state in the middle of FIG. 4 will be described later.

As described above, the difference between the contrast of the image, which is obtained by the upper side substrate 11A, and the contrast of the image, which is obtained by the lower side substrate 11B, is caused depending on the focus position. Therefore, the focus control is performed by comparing the contrast of the image, which is obtained by the upper side substrate 11A, with the contrast of the image which is obtained by the lower side substrate 11B.

Further, by detecting which one is higher between the contrast of the image obtained by the upper side substrate 11A and the contrast of the image obtained by the lower side substrate 11B, it is possible to detect an adjustment direction of autofocus. Therefore, it is possible to perform autofocus at a high speed.

Furthermore, a distance to the object 3 can also be estimated from the difference between the contrast of the image obtained by the upper side substrate 11A and the contrast of the image obtained by the lower side substrate 11B, and the focus position can also be adjusted by a single imaging operation.

Spectroscopic Properties of Semiconductor Substrates 11A and 11B

Figure 5:
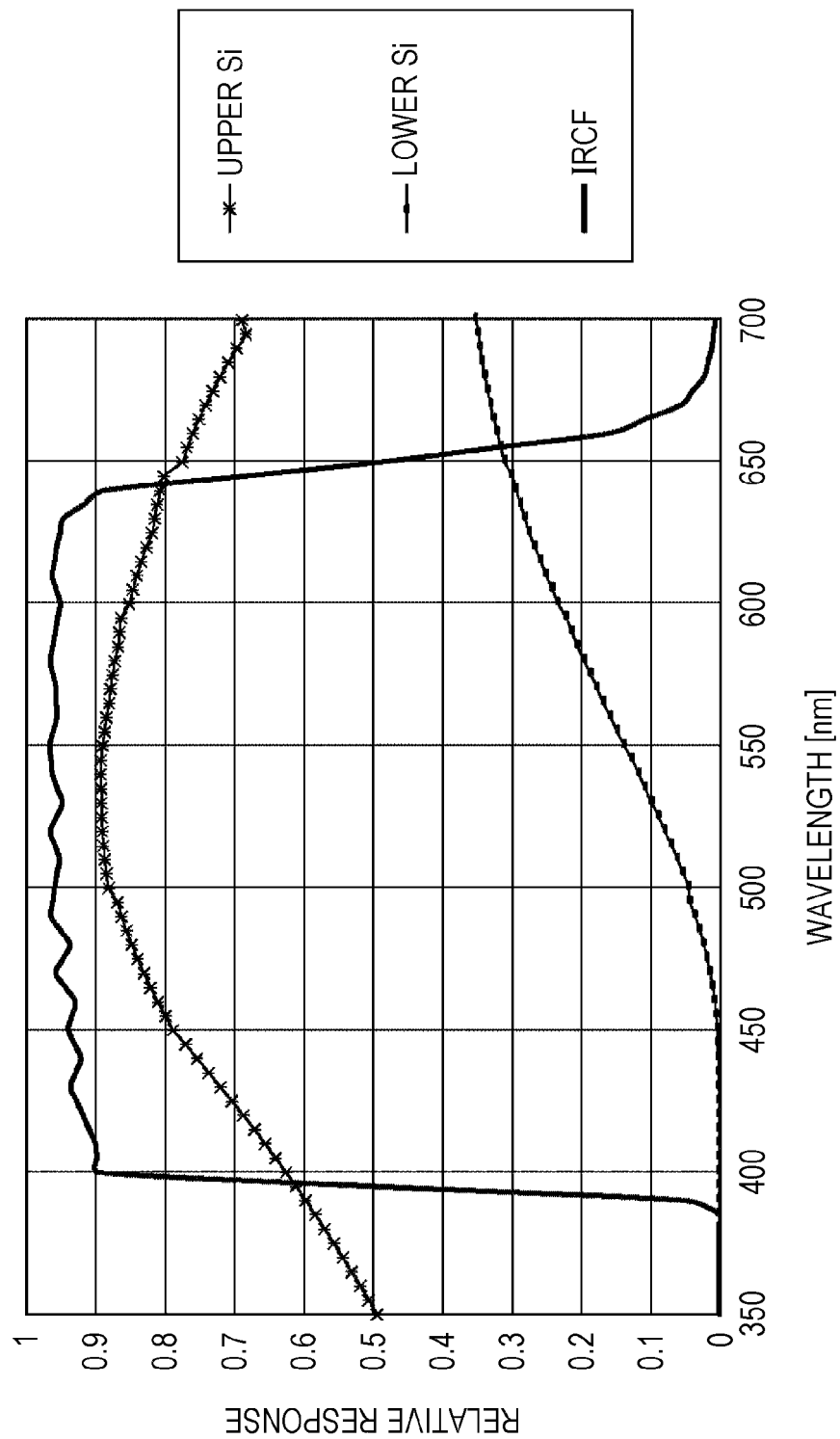
FIG. 5 is a diagram illustrating spectroscopic properties of light which is incident on the upper side substrate and the lower side substrate.
Figure 6:
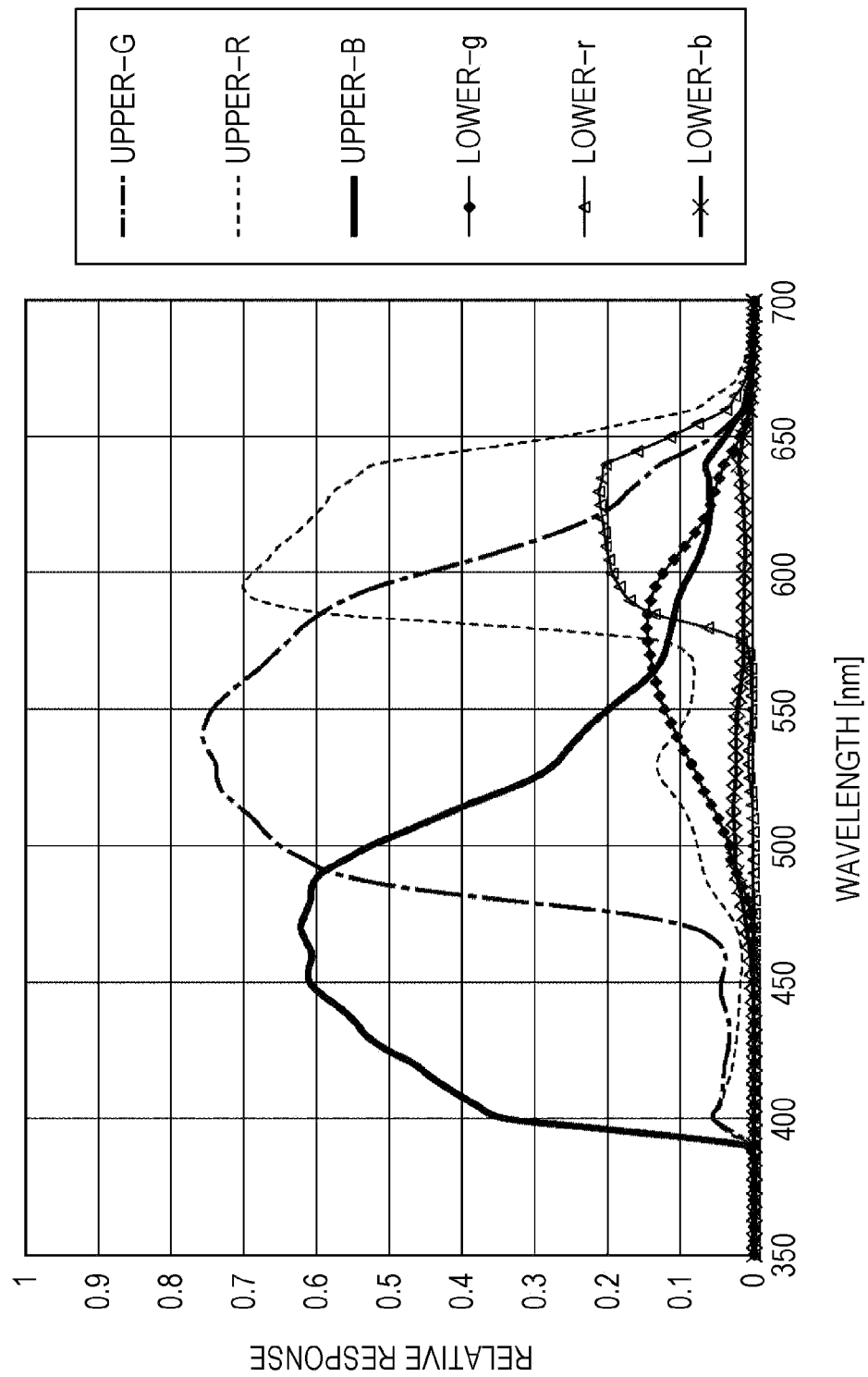
FIG. 6 is a diagram illustrating spectroscopic properties of the incident light.

Referring to FIGS. 5 and 6, spectroscopic properties of the light incident on the upper side substrate 11A and the lower side substrate 11B will be described.

In FIG. 5, the curve, which is represented by the IRCF, indicates spectroscopic properties of an infrared cut filter. The infrared cut filter having such spectroscopic properties is, for example, provided between the optical lens 2 and the upper side substrate 11A, or the optical lens 2 is formed as a lens having such spectroscopic properties. Thereby, it is possible to make the light, in which infrared light is cut off, incident on the solid-state imaging device 1.

Further, in FIG. 5, the curve, which is represented by Upper Si, indicates spectroscopic properties of light incident on a silicon layer of the upper side substrate 11A which has no color filter. The curve, which is represented by Lower Si, indicates spectroscopic properties of light incident on a silicon layer of the lower side substrate 11B which has no color filter.

Light, which is transmitted through the upper side substrate 11A, is incident on the lower side substrate 11B. Hence, a difference in spectroscopic properties is caused between the light incident on the upper side substrate 11A and the light incident on the lower side substrate 11B. As shown in FIG. 5, light in a range from short wavelength to long wavelength is incident on the upper side substrate 11A so as to be substantially uniform. In contrast, mostly light with the long wavelength is incident on the lower side substrate 11B.

FIG. 6 shows spectroscopic properties of the light incident on the silicon layer of the upper side substrate 11A and spectroscopic properties of the light incident on the silicon layer of the lower side substrate 11B, in a state where the R, G, or B color filter is formed on the upper side substrate 11A.

In FIG. 6, the curve, which is represented by Upper-G, indicates spectroscopic properties of light incident on the silicon layer of the pixel 21A of the upper side substrate 11A on which the G color filter is formed. The curve, which is represented by Lower-g, indicates spectroscopic properties of light incident on the silicon layer of the pixel 21B of the lower side substrate 11B corresponding to the G pixel of the upper side substrate 11A.

Further, in FIG. 6, the curve, which is represented by Upper-R, indicates spectroscopic properties of light incident on the silicon layer of the pixel 21A of the upper side substrate 11A on which the R color filter is formed. The curve, which is represented by Lower-r, indicates spectroscopic properties of light incident on the silicon layer of the pixel 21B of the lower side substrate 11B corresponding to the R pixel of the upper side substrate 11A.

Further, in FIG. 6, the curve, which is represented by Upper-B, indicates spectroscopic properties of light incident on the silicon layer of the pixel 21A of the upper side substrate 11A on which the B color filter is formed. The curve, which is represented by Lower-b, indicates spectroscopic properties of light incident on the silicon layer of the pixel 21B of the lower side substrate 11B corresponding to the B pixel of the upper side substrate 11A.

As can be seen from FIG. 6, the R, G, and B light is incident on the upper side substrate 11A at substantially the same intensity. However, as described with reference to FIG. 5, only the light with the long wavelength is incident on the lower side substrate 11B, and thus the R and G light is incident, but barely any B light is rarely incident. Further, an intensity of the light, which is incident on the upper side substrate 11A, is extremely different from an intensity of the light which is incident on the lower side substrate 11B.

Consequently, in order to perform focus control by calculating the difference between the contrast of the image obtained by the upper side substrate 11A and the contrast of the image obtained by the lower side substrate 11B, it is a premise that it is necessary to match the spectroscopic properties of the signal obtained by the upper side substrate 11A and the signal obtained by the lower side substrate 11B.

In the present specification, as methods of matching the spectroscopic properties of the signal obtained by the upper side substrate 11A and the signal obtained by the lower side substrate 11B, the following two methods are given:

(1) A method of matching the spectroscopic properties by performing weighted addition on the signals obtained by the substrates 11; and (2) A method of matching the spectroscopic properties by providing a light blocking layer, which is for controlling a transmittance, between the upper side substrate 11A and the lower side substrate 11B.

Hereinafter, the two methods of matching the spectroscopic properties will be described in detail.

Method of Matching Spectroscopic Properties Through Weighted Addition

First, as a first method of matching the spectroscopic properties, the method of matching the spectroscopic properties by performing weighted addition on the signals obtained by the substrates 11 will be described.

For example, the signal obtained by the upper side substrate 11A is subjected to weighted addition of $$wU1=0.21G+0.5R \tag{1}$$

and the signal obtained by the lower side substrate 11B is subjected to weighted addition of $$wL1=2g+r+b \tag{2}$$

Thereby, the results of the weighted additions of Expression (1) and Expression (2) are used in the focus control according to the contrast method.

Here, Expression (1) indicates that a signal, in which a value of 0.21 times the G signal obtained by the G pixels of the upper side substrate 11A is added to a value of 0.5 times the R signal obtained by the R pixels of the upper side substrate 11A, is a signal wU1 of the upper side substrate 11A for focus control.

Expression (2) indicates that a signal, in which a value of 2 times a g signal (a value corresponding to two pixels), an r signal, and a b signal are added, is a signal wL1 of the lower side substrate 11B for focus control. Here, the g signal is obtained by the pixels 21B of the lower side substrate 11B corresponding to the G pixels of the upper side substrate 11A, the r signal is obtained by the pixels 21B of the lower side substrate 11B corresponding to the R pixels of the upper side substrate 11A, and the b signal is obtained by the pixels 21B of the lower side substrate 11B corresponding to the B pixels of the upper side substrate 11A.

Figure 7:
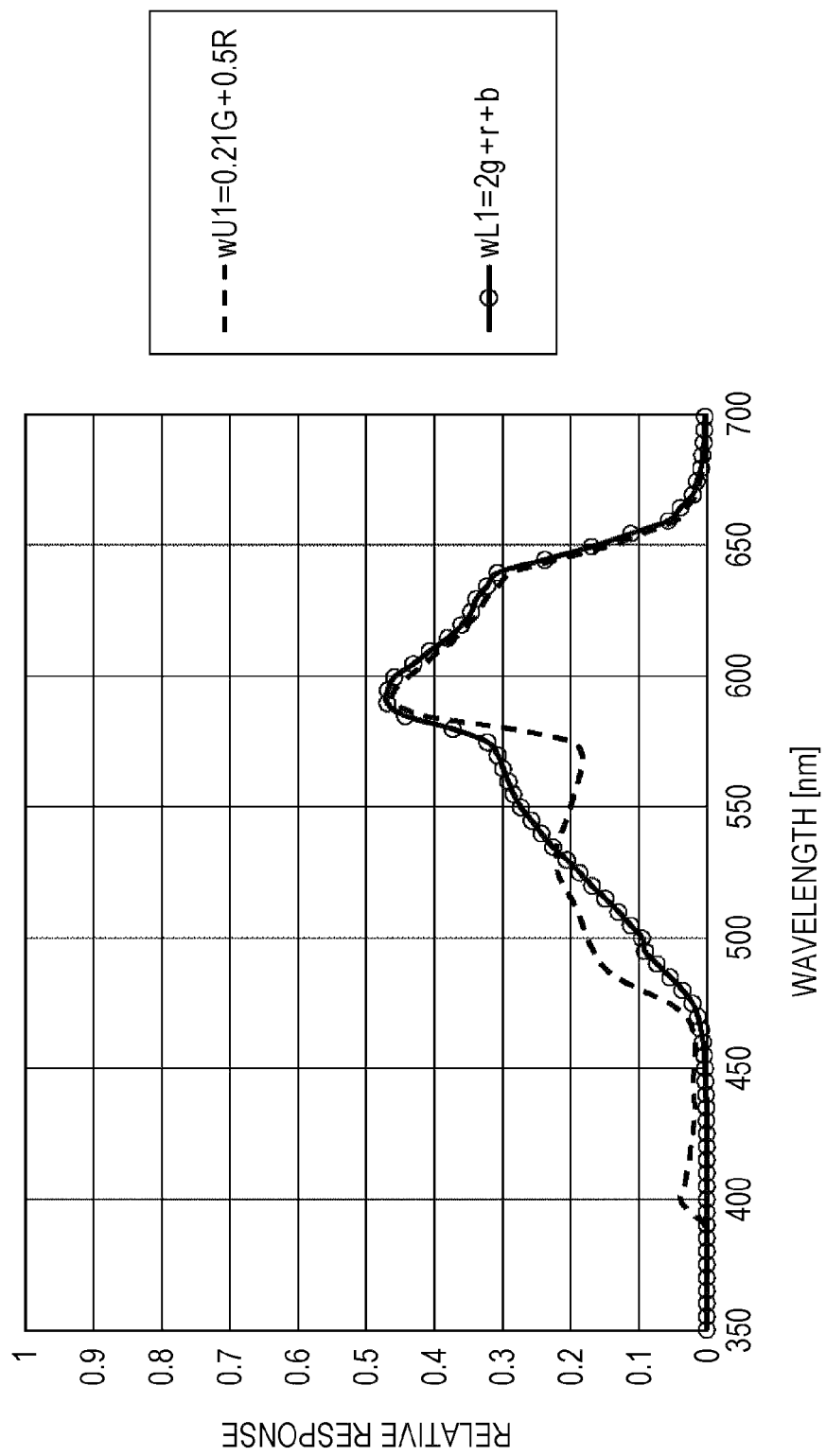
FIG. 7 is a diagram illustrating spectroscopic properties of a signal of the upper side substrate and a signal of the lower side substrate.

FIG. 7 is a diagram illustrating spectroscopic properties of the signal wU1 of the upper side substrate 11A obtained through weighted addition and the signal wL1 of the lower side substrate 11B.

In a similar manner to the above-mentioned Expressions (1) and (2), by performing weighted addition on the signals obtained by the substrates 11, as shown in FIG. 7, it is possible to match the spectroscopic properties of the signal obtained by the upper side substrate 11A and the signal obtained by the lower side substrate 11B. Thereby, it is possible to perform focus control using the difference between the contrast of the image obtained by the upper side substrate 11A and the contrast of the image obtained by the lower side substrate 11B.

Here, the signal wL1, which is represented by Expression (2) and obtained by the lower side substrate 11B, is equivalent to combination of colors of the color array which is a repeated unit of the Bayer array in which the color filters of the two G pixels, the single R pixel, and the single B pixel are arranged.

Figure 8:
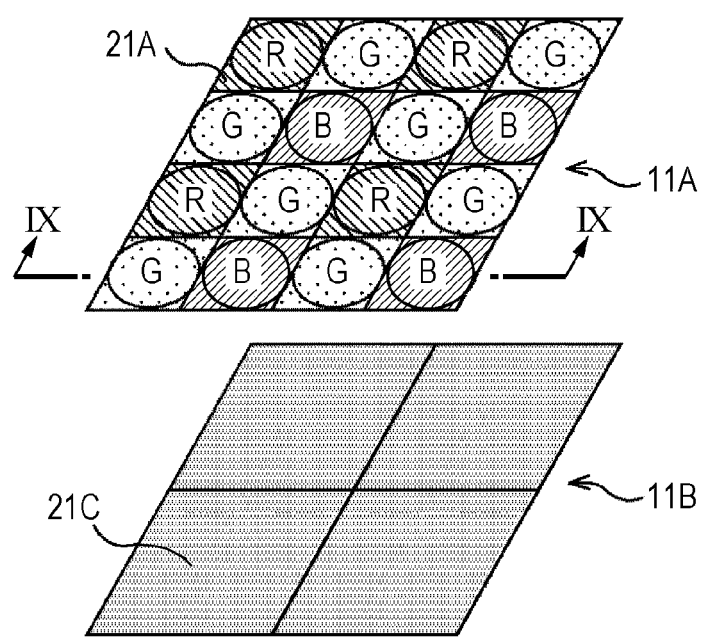
FIG. 8 is a diagram illustrating a schematic configuration of an upper side substrate and a lower side substrate.

Accordingly, a single pixel 21C may be formed on the lower side substrate 11B so as to correspond to 4 pixels which are equivalent to the repeated unit of the color array of the Bayer array and are formed of 2×2 pixels of the upper side substrate 11A, as shown in FIG. 8.

In other words, as shown in FIG. 3, the pixels 21B may be formed on the lower side substrate 11B, with a pixel pitch corresponding to the pixels 21A of the upper side substrate 11A. In addition, as shown in FIG. 8, the pixels 21C may be formed on the lower side substrate 11B, with a pitch of repetition of the color array of the color filters of the upper side substrate 11A.

Figure 9:
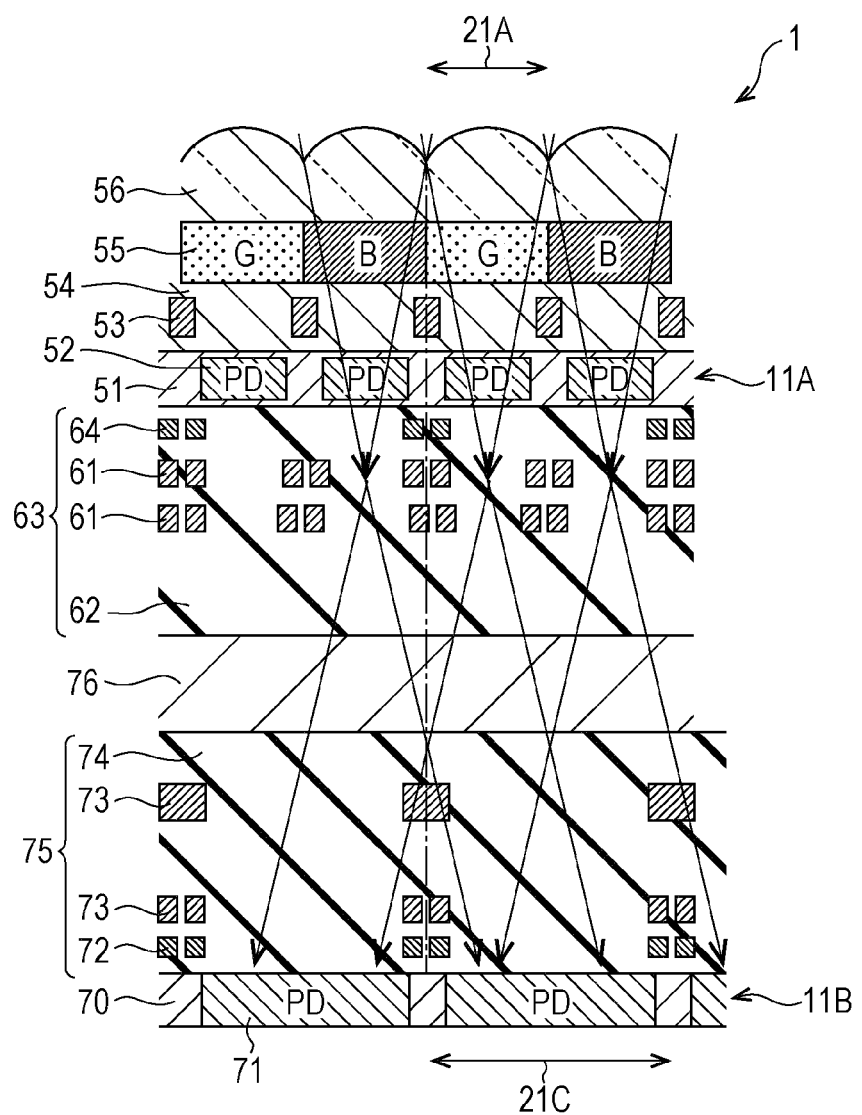
FIG. 9 is a cross-sectional configuration diagram of the solid-state imaging device.

FIG. 9 is a cross-sectional configuration diagram of the solid-state imaging device 1 along line IX-IX of FIG. 8.

As shown in FIG. 9, the solid-state imaging device 1 is configured such that the back-side-illumination-type upper side substrate 11A (semiconductor substrate 11A) and the front-side illumination-type lower side substrate 11B (semiconductor substrate 11B) are laminated.

More specifically, the upper side substrate 11A includes, for example, a silicon layer 51 which is an n type (first conductive type) semiconductor region. In the silicon layer 51, a photodiode (PD) 52 as a photoelectric conversion portion is formed for each pixel through a pn junction.

A planarizing film 54 is formed on the upper side of the upper side substrate 11A, on which light is incident, as the back side of the upper side substrate 11A, so as to cover a light blocking film 53. Furthermore, R, G, and B color filters 55 and an on-chip lens 56 are formed on the upper side of the planarizing film 54.

In contrast, a multilevel wiring layer 63, which includes a plurality of wiring layers 61 and an interlayer insulation film 62, is formed on the lower side (front side) of the upper side substrate 11A. In the multilevel wiring layer 63, a plurality of transistor circuits 64, which constitutes a reading circuit that reads signal charges accumulated in the photodiodes 52, is formed in the vicinity of the silicon layer 51.

The lower side substrate 11B includes, for example, a silicon layer 70 which is an n type (first conductive type) semiconductor region. In the silicon layer 70, a photodiode (PD) 71 as a photoelectric conversion portion is formed for each pixel through a pn junction. Here, the pixel size of the lower side substrate 11B is set as a size corresponding to two pixels of the upper side substrate 11A.

A multilevel wiring layer 75 is formed on the upper side of the lower side substrate 11B. The multilevel wiring layer 75 includes a plurality of transistor circuits 72 which constitutes a reading circuit that reads signal charges accumulated in the photodiodes 71, a plurality of wiring layers 73, an interlayer insulation film 74, and the like. A protective film 76 is formed on the multilevel wiring layer 75, and the upper side substrate 11A and the lower side substrate 11B are bonded (attached) with the protective film 76 interposed therebetween.

In the photodiode 71 of the lower side substrate 11B, as described above, the signal of a region corresponding to the plurality of pixels of the upper side substrate 11A is used in detection of the contrast difference. Hence, it is not necessary to make a light receiving region of the lower side substrate 11B correspond to the pixel 21A of the upper side substrate 11A. Hence, as indicated by the arrow in FIG. 9, the photodiode 71 of the lower side substrate 11B can be configured such that light, which is incident into a single pixel of the upper side substrate 11A, is scattered while traveling to the lower side substrate 11B, and is incident on a region of the plurality of pixels.

Consequently, it is not necessary to provide an interlayer lens between the photodiodes 52 of the upper side substrate 11A and the photodiodes 71 of the lower side substrate 11B.

The interlayer lens is for concentrating light, which passes through the photodiodes 52 of the upper side substrate 11A, on the photodiodes 71.

Further, in the lower side substrate 11B, the pixels 21C may be formed with a pitch of repetition of the color array of the color filters of the upper side substrate 11A, and it is not necessary for the positions of the pixels 21C of the lower side substrate 11B in the planar direction to coincide with the pixel regions of the upper side substrate 11A.

Figure 10:
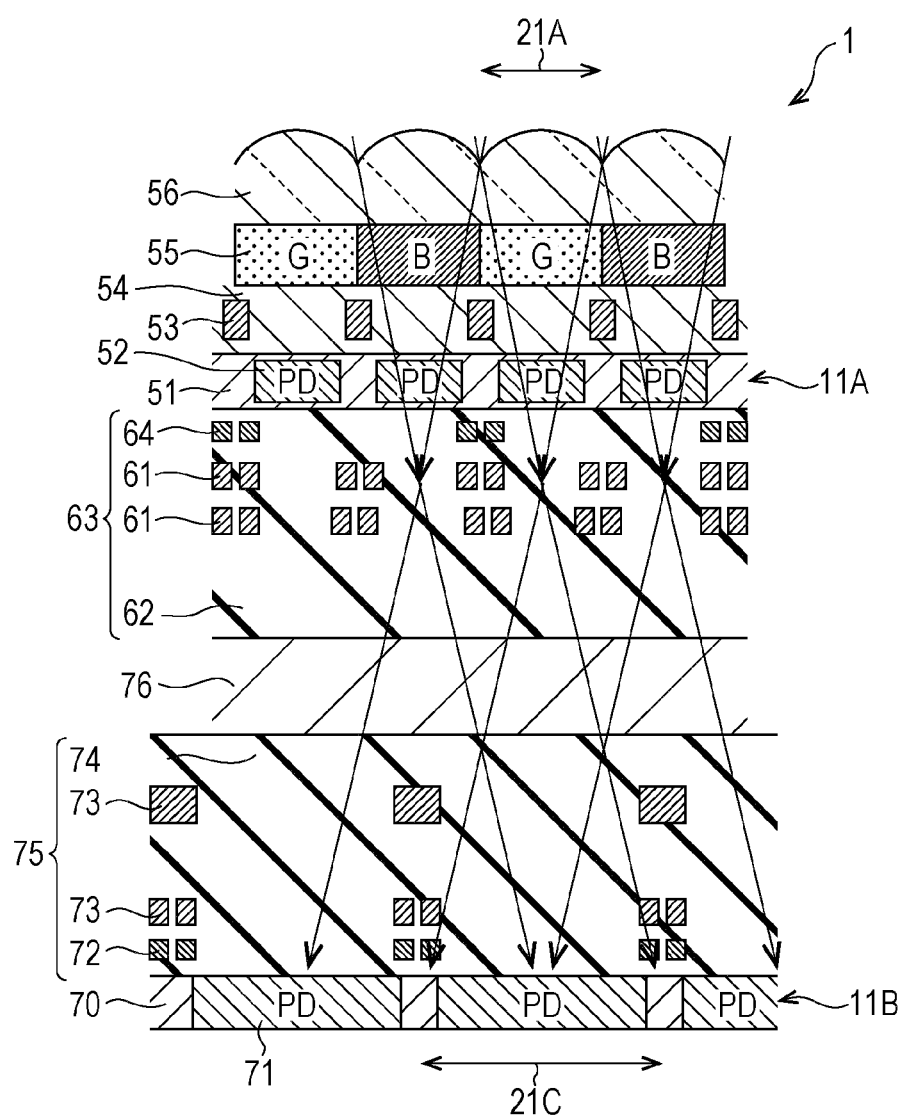
FIG. 10 is a cross-sectional configuration diagram of the solid-state imaging device.

Hence, for example, as shown in FIG. 10, the positions of the pixels 21C of the lower side substrate 11B in the planar direction may be deviated from the pixel regions of the upper side substrate 11A. In FIG. 9, as indicated by the chain line in the drawing, the positions of the transistor circuits 64 of the upper side substrate 11A coincide with the positions of the transistor circuits 72 of the lower side substrate 11B. However, in FIG. 10, the positions of the circuits do not coincide.

The solid-state imaging device 1 has a cross-section structure shown in FIG. 9 or 10, and is thus able to control the focus by matching the spectroscopic properties of the signal obtained by the upper side substrate 11A and the signal obtained by the lower side substrate 11B and calculating the contrast difference between the images obtained by the upper and lower substrates 11.

In the method of performing focus control using the contrast difference between the images obtained by the upper and lower substrates 11, it is not necessary for the upper and lower pixel positions to precisely coincide with each other. Hence, robustness with respect to misalignment is excellent.

Method of Matching Spectroscopic Properties by Providing Light Blocking Layer

Next, as a second method of matching spectroscopic properties, a method of matching the spectroscopic properties by providing the light blocking layer will be described.

Figure 11:
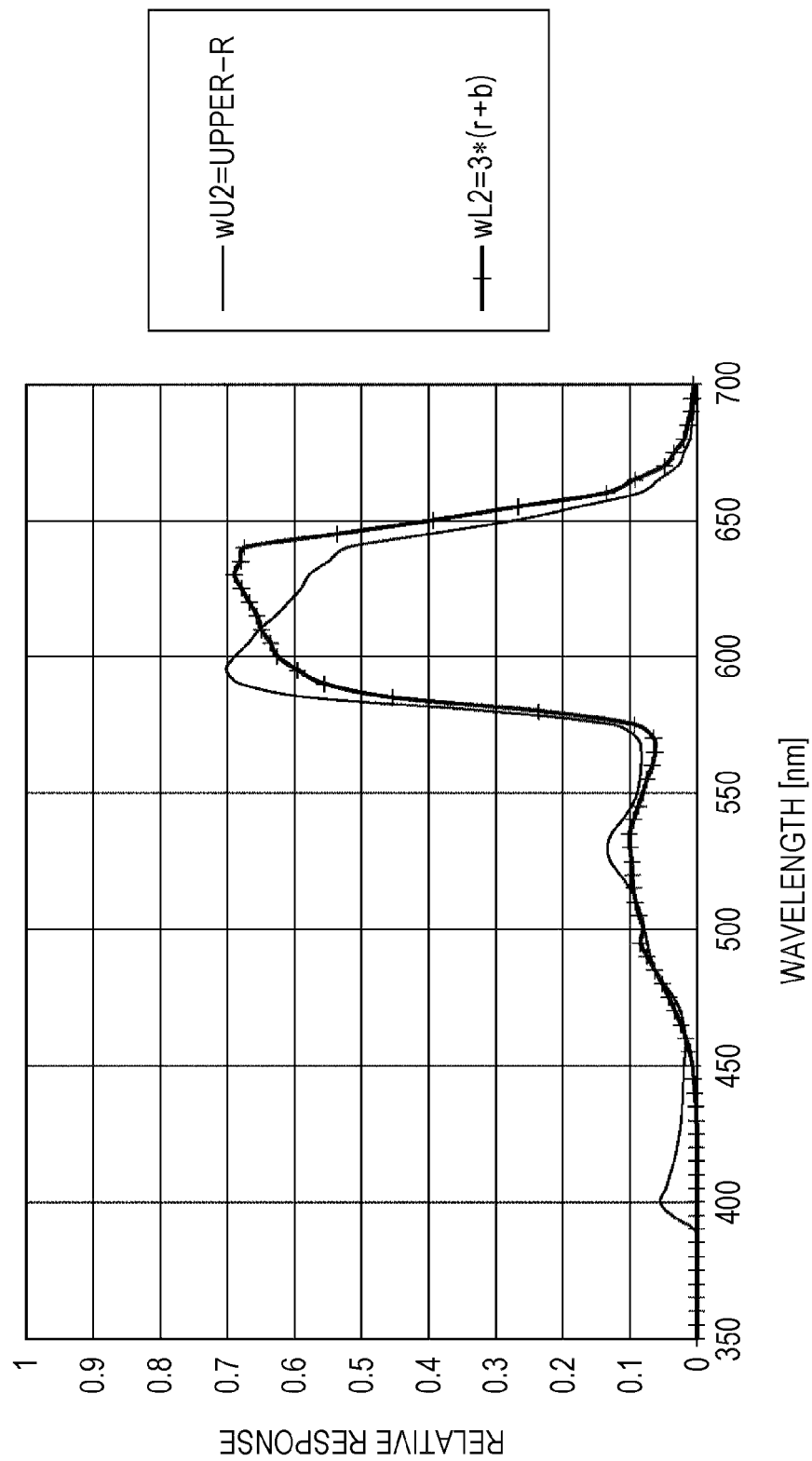
FIG. 11 is a diagram illustrating spectroscopic properties of a signal of the upper side substrate and a signal of the lower side substrate.

FIG. 11 is a diagram illustrating spectroscopic properties of the signal obtained by the upper side substrate 11A and the signal obtained by the lower side substrate 11B according to the second method.

In FIG. 11, the curve, which is represented by Upper-R, indicates spectroscopic properties of the light incident on the R pixels of the upper side substrate 11A.

In FIG. 11, the curve, which is represented by 3*(r+b), indicates spectroscopic properties of a signal which is 3 times a result of addition of the r signal and the b signal, when light passing through the G pixels of the upper side substrate 11A is blocked and light passing through the R pixels and B pixels of the upper side substrate 11A is incident on the lower side substrate 11B. The r signal is obtained by the pixels 21B of the lower side substrate 11B corresponding to the R pixels of the upper side substrate 11A. The b signal is obtained by the pixels 21B of the lower side substrate 11B corresponding to the B pixels of the upper side substrate 11A.

As shown in FIG. 11, the R signal of the upper side substrate 11A is set as a signal wU2 of the upper side substrate 11A for focus control, and the signal, which is 3 times the sum of the r signal and b signal of the lower side substrate 11B, is set as a signal wL2 of the lower side substrate 11B for focus control. Thereby, it is possible to match the spectroscopic properties of the upper and lower side substrates 11A and 11B.

That is, signals of the following Expressions (3) and (4) are used in focus control according to the contrast method.

$$wU2 = R \quad (3)$$

$$wL2 = 3(r+b) \quad (4)$$

It should be noted that, in the second method, as described above, the contrast difference is calculated using the R signal and the B signal. Generally, when there is chromatic aberration, the focus position of the R signal is farthest from the object 3, and subsequently the focus positions of the G signal and B signal are lined up in this order. In the just focus state shown in the middle of FIG. 4, when the contrast is adjusted centering on the R signal as indicated by the solid line, due to the relationship of the signals with the above-mentioned chromatic aberration, the focus position of the G signal is on the upper side substrate 11A as indicated by the dashed line. The G signal has high resolution to the human eye, and the G signal is used as a luminance signal in the signal processing. Therefore, it is preferable that the G signal be precisely focused on the upper side substrate 11A. Consequently, it is preferable that the contrast difference be calculated centering on the R signal even in view of the relationship of the signals with chromatic aberration. However, since light of the G signal is blocked, the sensitivity is lowered. As a result, in view of the S/N ratio, this method is disadvantageous.

A configuration of the solid-state imaging device 1 for implementing the second method will be described.

2. Second Embodiment of Solid-State Imaging Device

Figure 12:
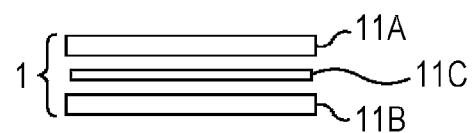
FIG. 12 is a diagram illustrating a solid-state imaging device according to a second embodiment of the present disclosure.

FIG. 12 is a diagram illustrating a solid-state imaging device 1 according to a second embodiment of the present disclosure.

It should be noted that, in FIG. 12 and the following drawings, elements corresponding to those in the above-mentioned drawings are represented by the same reference numerals and signs, and a description thereof will be appropriately omitted.

In the solid-state imaging device 1 according to the second embodiment, an aperture 11C as a light blocking layer, which partially blocks the incident light, is further provided between the upper side substrate 11A and the lower side substrate 11B.

Figure 13:
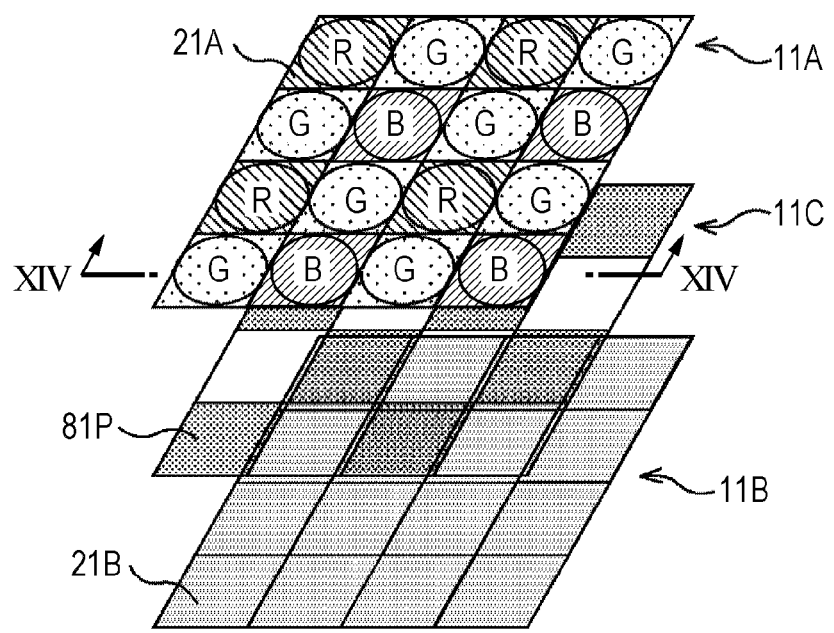
FIG. 13 is a diagram illustrating a schematic configuration of an upper side substrate, a lower side substrate, and an aperture.

FIG. 13 is a diagram illustrating a schematic configuration of the upper side substrate 11A, the lower side substrate 11B, and the aperture 11C of FIG. 12.

A light blocking pattern 81P is formed on the aperture 11C, and the light blocking pattern 81P is divided to correspond to regions of the pixels 21A of the upper side substrate 11A as shown in FIG. 13, and is formed as a pattern for blocking light in the regions corresponding to the G pixels of the upper side substrate 11A.

Figure 14:
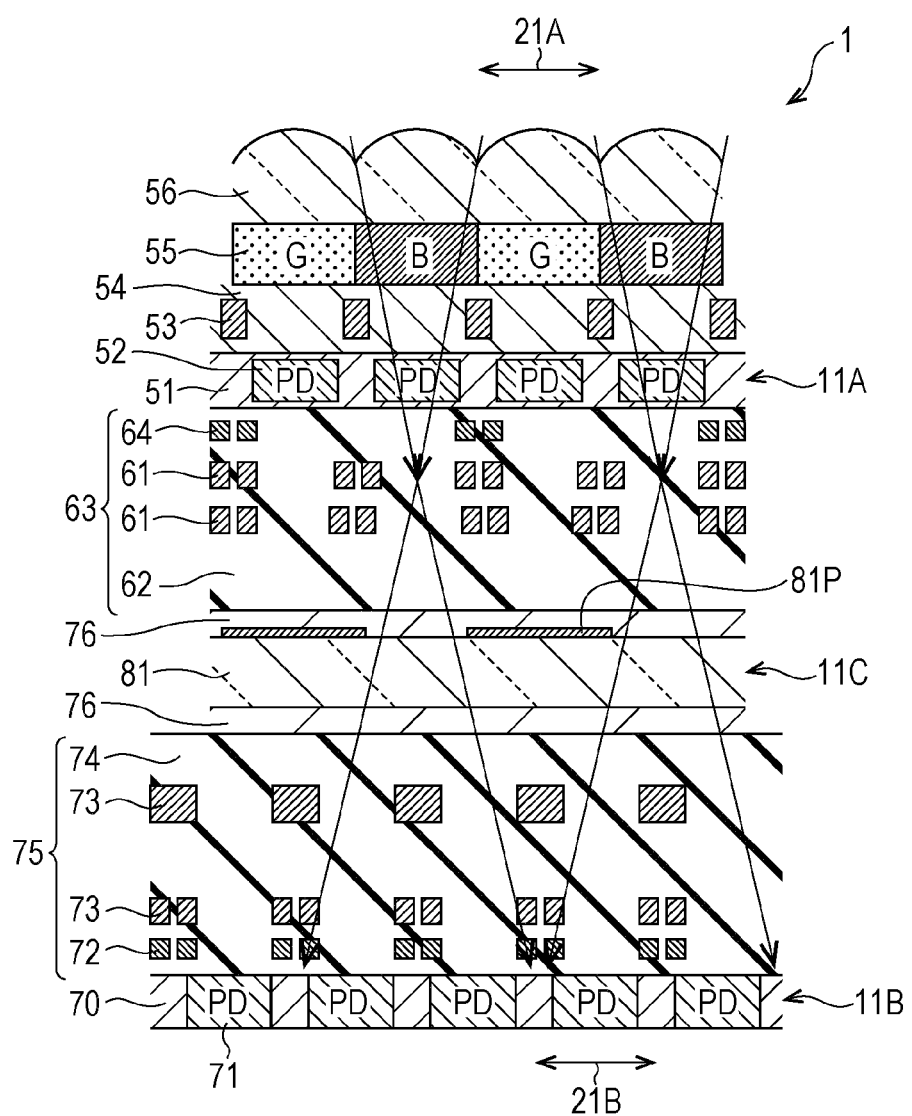
FIG. 14 is a cross-sectional configuration diagram of the solid-state imaging device according to the second embodiment.

FIG. 14 is a cross-sectional configuration diagram of the solid-state imaging device 1 along line XIV-XIV of FIG. 13.

In the solid-state imaging device 1 according to the second embodiment, as shown in FIG. 14, the aperture 11C is inserted to be interposed between the upper side substrate 11A and the protective film 76 of the lower side substrate 11B.

The aperture 11C is, for example, configured such that the light blocking pattern 81P is deposited in the regions corresponding to the G pixels on a surface of a glass layer 81 close to the upper side substrate 11A.

The other configuration of the solid-state imaging device 1 of FIG. 14 is the same as that in the first embodiment shown in FIG. 9 or the like. However, in the cross-sectional configuration diagram of FIG. 9, a single pixel of the lower side substrate 11B has a size corresponding to two pixels of the upper side substrate 11A. In contrast, in FIG. 14, a single pixel of the lower side substrate 11B is formed to have a size corresponding to a single pixel of the upper side substrate 11A.

Figure 15:
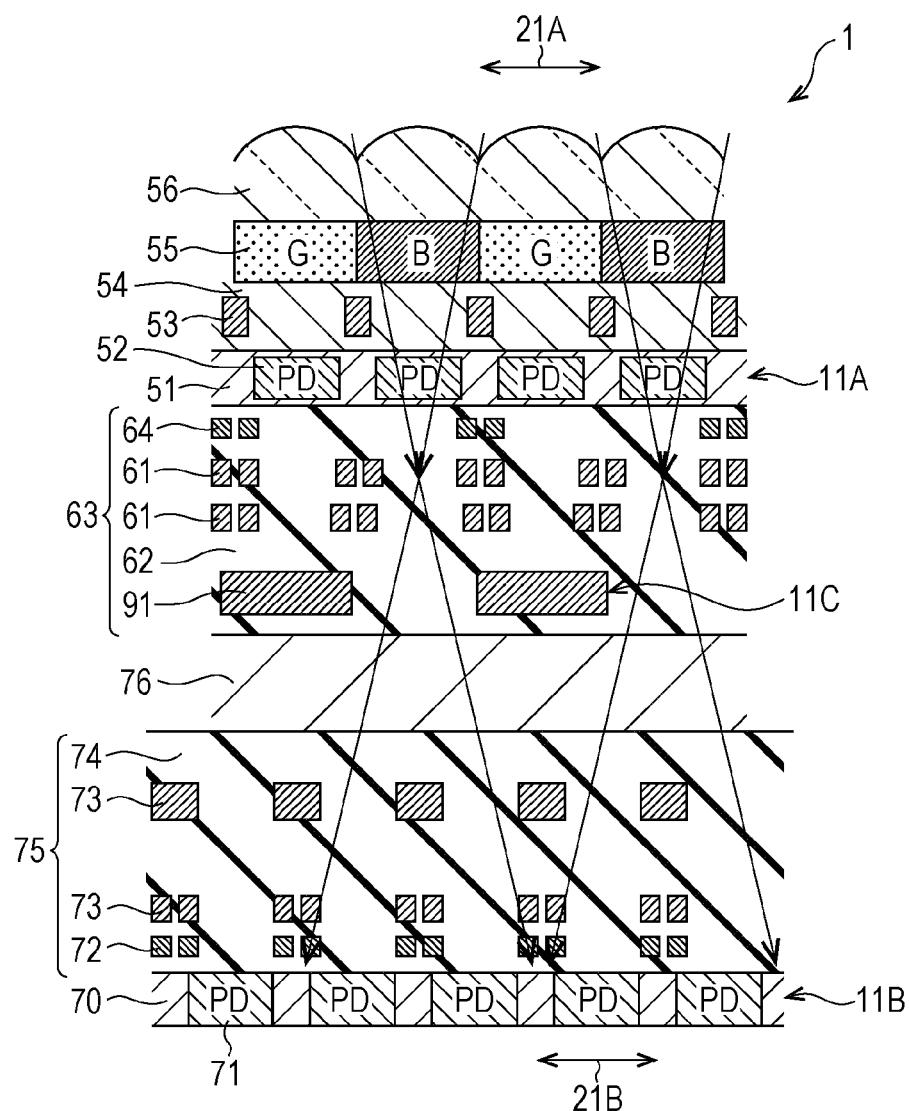
FIG. 15 is another cross-sectional configuration diagram of the solid-state imaging device according to the second embodiment.

FIG. 15 is another cross-sectional configuration diagram of the solid-state imaging device 1 according to the second embodiment.

In the cross-sectional configuration of FIG. 15, the aperture 11C is formed of a conductive material, which has a light blocking property the same as that of the wiring layers 61, as a part of the multilevel wiring layer 63. A wiring layer 91 as the aperture 11C is formed in regions corresponding to the G pixels of the upper side substrate 11A.

Figure 16:
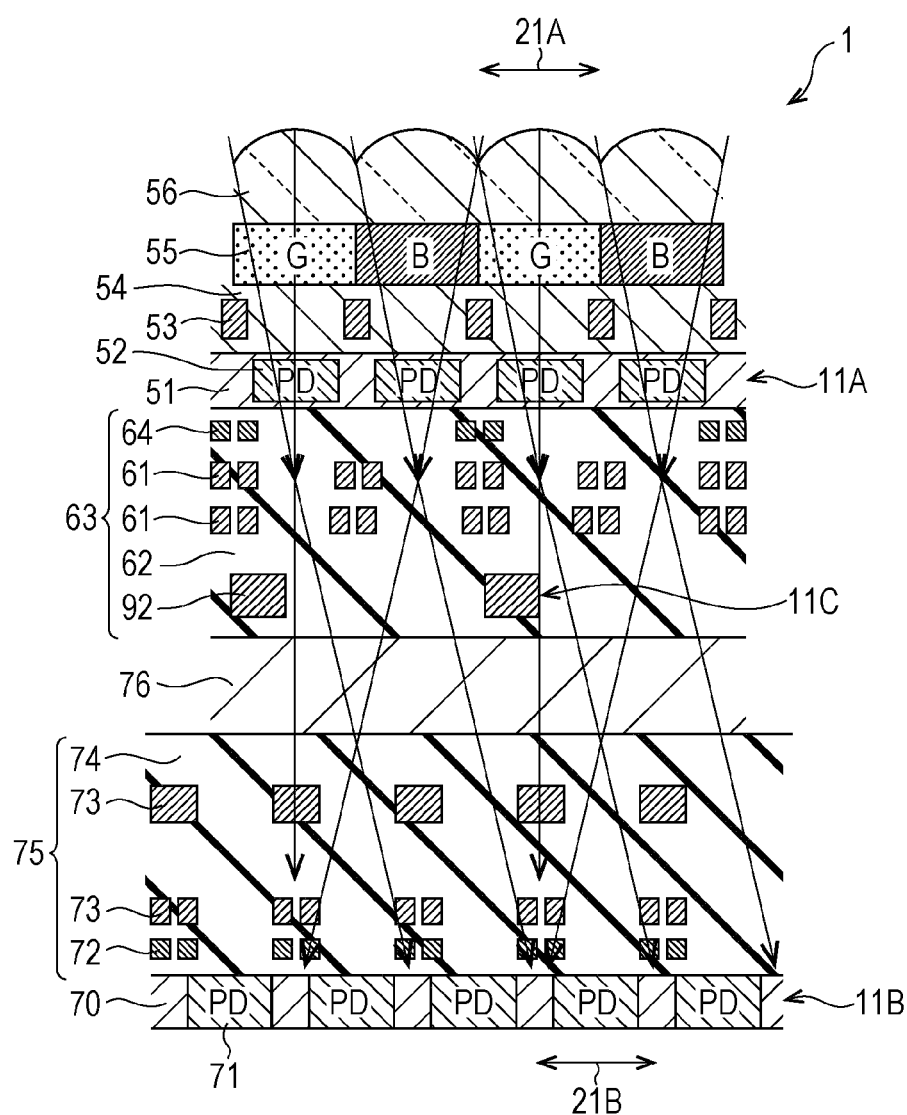
FIG. 16 is a further cross-sectional configuration diagram of the solid-state imaging device according to the second embodiment.

FIG. 16 is a further cross-sectional configuration diagram of the solid-state imaging device 1 according to the second embodiment.

In the cross-sectional configuration of FIG. 16, comparing the configuration with the cross-sectional configuration of FIG. 15, the regions of a wiring layer 92 as the aperture 11C are formed to be smaller than the regions of the wiring layer 91 of FIG. 15. In this case, the incident light passing through the G pixels of the upper side substrate 11A is also partially incident on the lower side substrate 11B. As described above, it is also possible to control transmittances of color signals (R signal, G signal, and B signal), which are incident from the upper side substrate 11A onto the lower side substrate 11B, through the aperture 11C.

As described above, the aperture 11C may be formed by the glass layer 81, and may be formed by the wiring layer 91 (92). However, it is preferable that the aperture 11C be formed by the wiring layer 91 (92) in that it is possible to use precision of matching of the semiconductor process.

Figure 17:
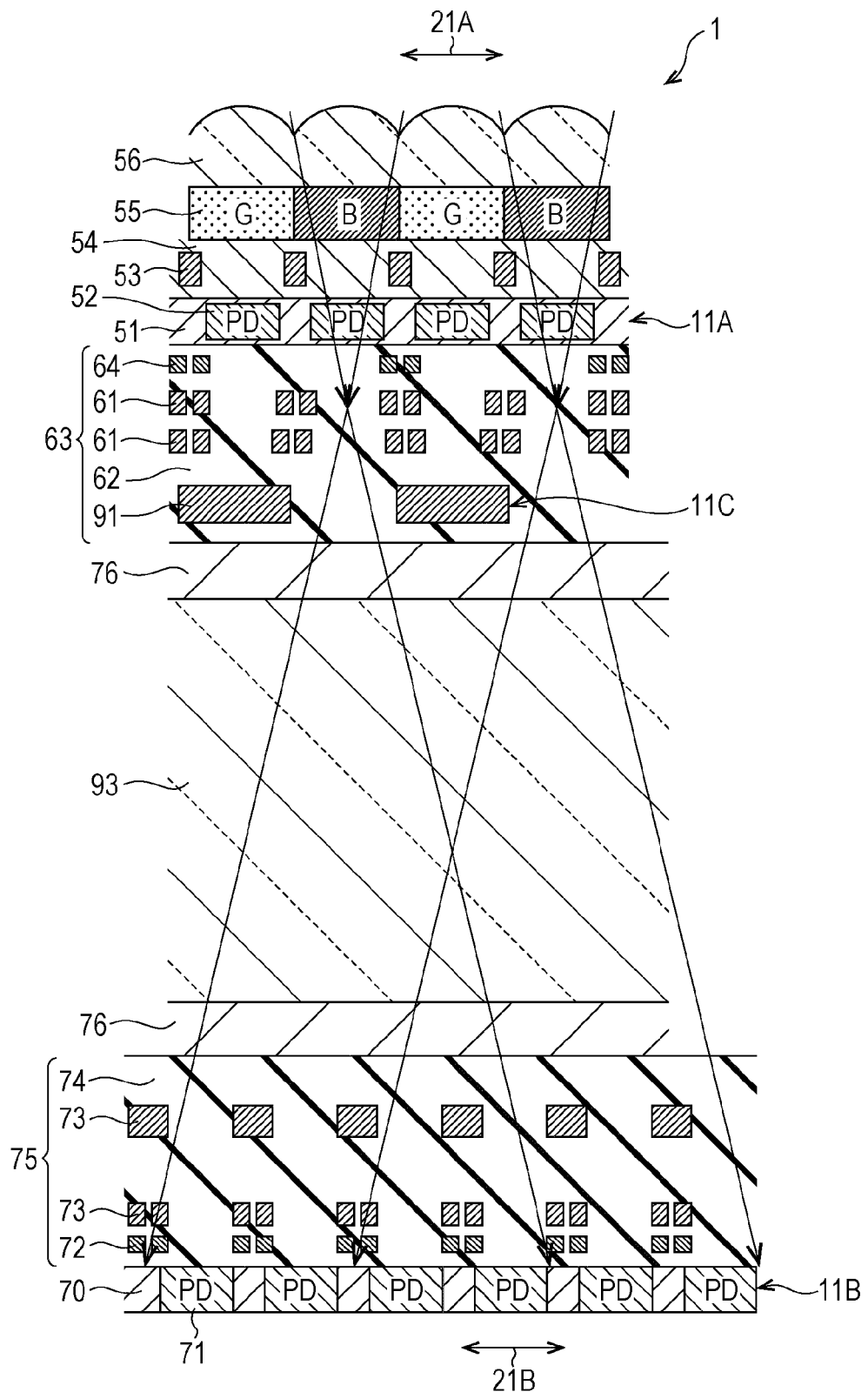
FIG. 17 is a further cross-sectional configuration diagram of the solid-state imaging device according to the second embodiment.

FIG. 17 is a further cross-sectional configuration diagram of the solid-state imaging device 1 according to the second embodiment.

In the cross-sectional configuration of FIG. 17, comparing the configuration with the cross-sectional configuration of FIG. 15, a glass layer as an intermediate layer 93 is inserted to be interposed between the upper side substrate 11A and the protective film 76 of the lower side substrate 11B. When the contrast difference between the images of the upper side substrate 11A and the lower side substrate 11B is small, it is possible to adopt a configuration in which the upper side substrate 11A and the lower side substrate 11B are spaced by inserting the intermediate layer 93 in such a manner. It should be noted that the intermediate layer 93 is not limited to glass, and may be formed of a transparent material.

Modification Examples of First and Second Embodiments

Modification examples of the first and second embodiments of the solid-state imaging device will be described.
Addition of Exposure Control Sensor In the imaging apparatus, three elements of autofocus, auto exposure, and auto white balance, so-called 3A, are important for control.

It is not necessary for an image signal for autofocus to be detected in the entire area of the upper side substrate 11A that generates a captured image. Hence, as described with reference to FIG. 2, a plurality of pixels 21B is formed on the lower side substrate 11B so as to correspond to only a part of the upper side substrate 11A.

Figure 18:
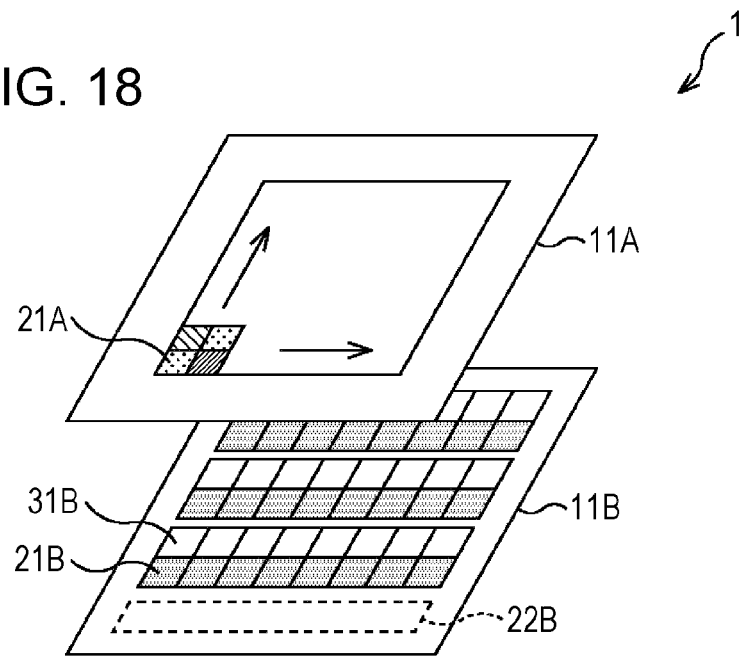
FIG. 18 is a diagram illustrating a modification example in which an exposure control sensor is added.

Accordingly, as shown in FIG. 18, in a region in which a plurality of autofocus pixels 21B of the lower side substrate 11B is not formed, a plurality of pixels 31B as an exposure control detection sensor can be formed.

In an image sensor having a single-layer structure other than a multilayer structure, exposure control is performed on the basis of an output level of a captured image. Hence, for example, when a luminance suddenly changes, a reading speed of an image is slow, and thus control for gradually shortening an exposure time period is performed. Hence, once the image is saturated, appropriate exposure is gradually performed, and thus a visually undesirable image may be obtained.

In contrast, in the solid-state imaging device 1, an exposure control signal is detected by the plurality of pixels 31B provided on the lower side substrate 11B different from the image sensor of the upper side substrate 11A. Further, since the pixels 21B and 31B are driven on a row-by-row basis, the driving can be performed by setting timing of exposure and reading of the plurality of exposure control pixels 31B separately from the plurality of autofocus pixels 21B. Therefore, it is possible to perform exposure control at a high speed, and thus it is possible to instantly perform appropriate exposure of the image sensor of the upper side substrate 11A.

Figure 19:
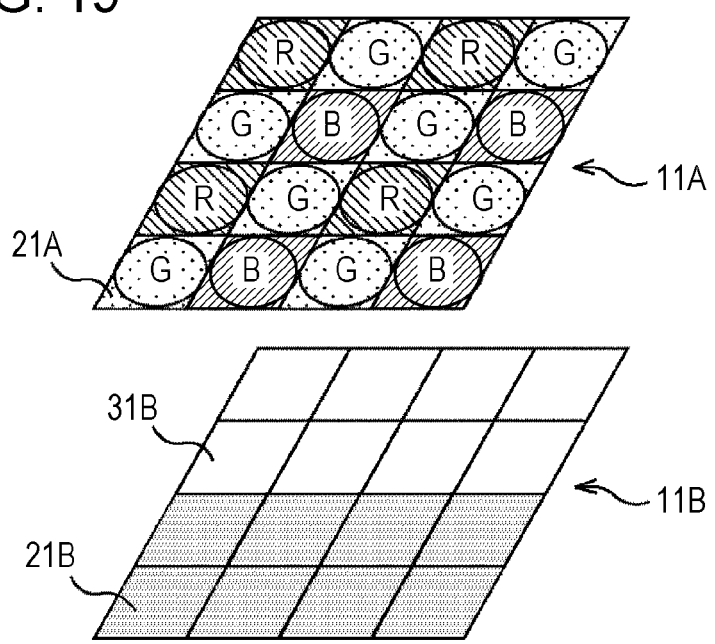
FIG. 19 is a diagram illustrating a modification example in which an exposure control sensor is added.

FIG. 19 shows an example in which the pixel size of the lower side substrate 11B is the same as the pixel size of the upper side substrate 11A and thus the plurality of autofocus pixels 21B and the plurality of exposure control pixels 31B are arranged on the lower side substrate 11B on a row-by-row basis.

Figure 20:
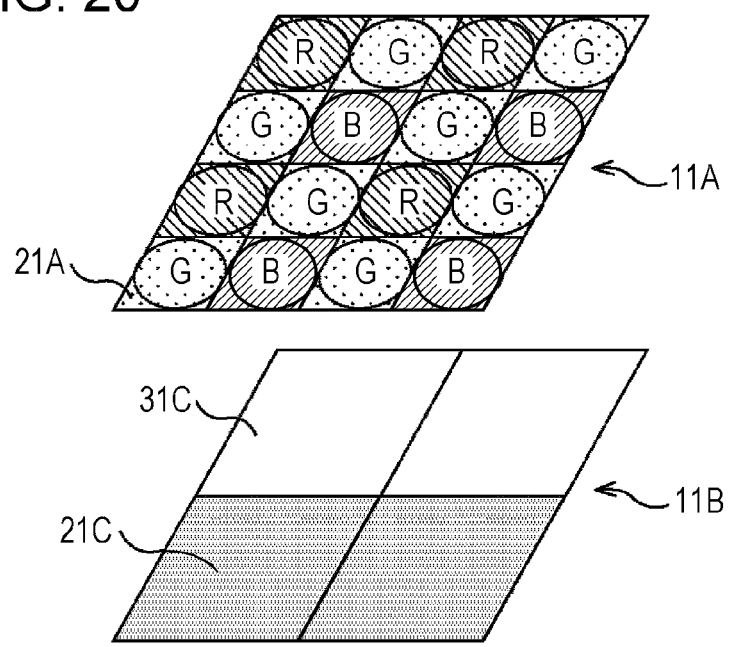
FIG. 20 is a diagram illustrating a modification example in which an exposure control sensor is added.

FIG. 20 shows an example in which the pixel size of the lower side substrate 11B is set as the pitch of repetition of the color array of the color filters of the upper side substrate 11A and thus the plurality of autofocus pixels 21C and a plurality of exposure control pixels 31C are arranged on a row-by-row basis.

Addition of Phase Difference Detection Sensor

As the focus control method, the contrast method is means which is effective near the focus position, and the image plane phase difference method is means which is effective at a location where the focus is significantly shifted.

Accordingly, phase difference pixels may be additionally provided on a part of the upper side substrate 11A.

Figure 21:
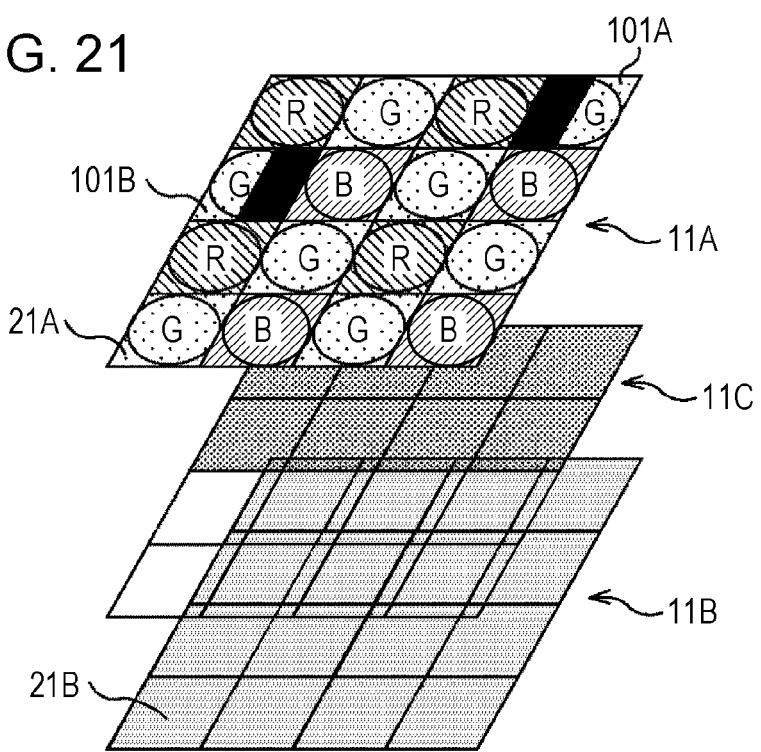
FIG. 21 is diagram illustrating a modification example in which a phase difference detection sensor is added.
Figure 22:
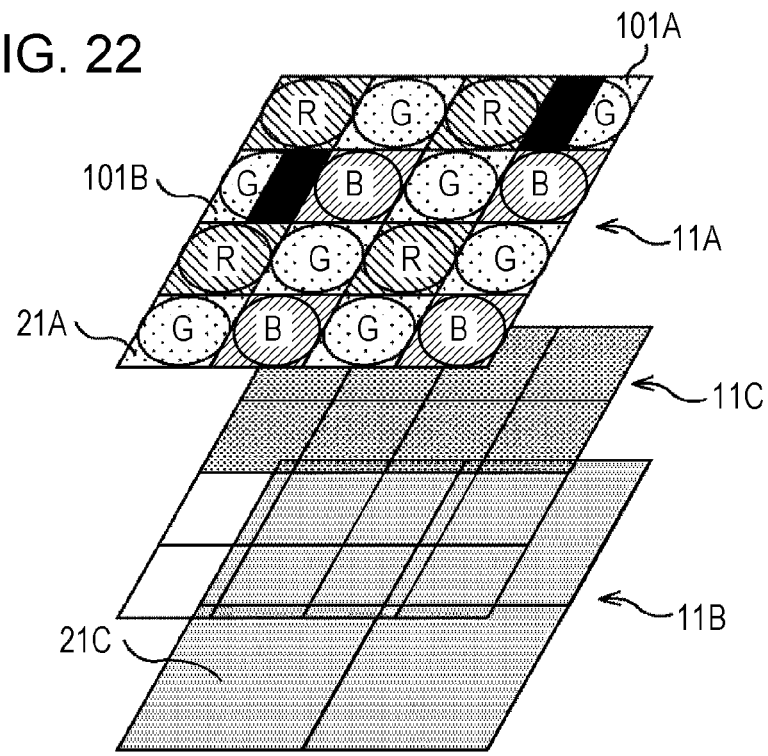
FIG. 22 is diagram illustrating a modification example in which a phase difference detection sensor is added.
Figure 23:
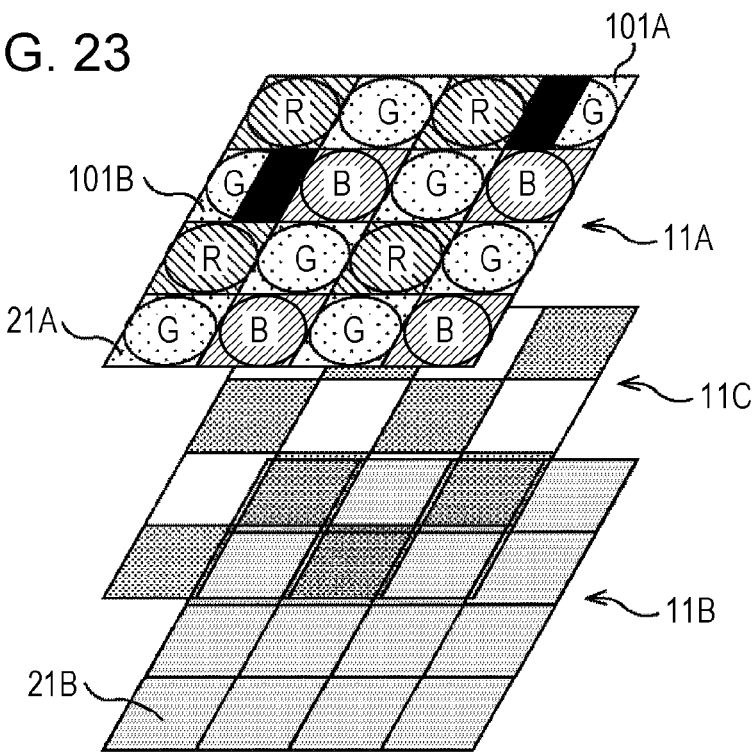
FIG. 23 is diagram illustrating a modification example in which a phase difference detection sensor is added.

FIGS. 21 to 23 show examples in which phase difference pixels 101 are additionally provided on a part of the upper side substrate 11A.

FIG. 21 shows an example in which some of imaging pixels 21A of the upper side substrate 11A are formed as phase difference detection pixels 101 in the solid-state imaging device 1 where the pixel size of the lower side substrate 11B is the same as the pixel size of the upper side substrate 11A. As the phase difference detection pixels 101, for example, two pixels 101A and 101B are symmetrically disposed such that light blocking regions are symmetric like a right-side light blocking region and a left-side light blocking region.

FIG. 22 shows an example in which some of imaging pixels 21A of the upper side substrate 11A are formed as phase difference detection pixels 101 in the solid-state imaging device 1 where the pixel size of the lower side substrate 11B is set as the pitch of repetition of the color array of the color filters of the upper side substrate 11A.

In each phase difference detection pixel 101, a part of the pixel region is shielded from light. Therefore, the intensity of the light, which is incident on the lower side substrate 11B, is weak, and is thus inappropriate for the signal for the contrast method. Hence, as shown in FIGS. 21 and 22, the pixel rows, in which the phase difference detection pixels 101 are disposed, are shielded from light by the aperture 11C, and a region, in which focus control is performed in the image plane phase difference method, and a region, in which focus control is performed in the contrast method, can be divided on a row-by-row basis.

The method of dividing the region, in which focus control is performed in the image plane phase difference method, and the region, in which focus control is performed in the contrast method, may be on a color-by-color basis shown in FIG. 23 other than a row-by-row basis shown in FIGS. 21 and 22.

The G signal has high resolution to the human eye, and the G signal is used as a luminance signal even in the signal processing. Therefore, it is preferable that the phase difference detection pixels 101 be disposed on the G pixels among the R, G, and B pixels. In such a case, as shown in FIG. 23, it is necessary for the G pixels to be shielded from light by the aperture 11C. However, in the second method of matching the spectroscopic properties, the G pixels are shielded from light. Therefore, the configuration of FIG. 23 is appropriate for the second method of matching the spectroscopic properties.

That is, the configuration of the solid-state imaging device 1 shown in FIG. 23 is most appropriate for hybrid type autofocus. In the autofocus, focus control of the contrast method is performed by matching the spectroscopic properties through the second method, and focus control is performed through the phase difference detection.

In contrast, in the configuration of the solid-state imaging device 1 shown in FIGS. 21 and 22, the G signal can also be used in focus control of the contrast method. Therefore, there is an advantage in that focus precision is high even in a dark scene. Further, the exposure reading timing is controlled on a row-by-row basis, and thus the plurality of exposure control pixels 31B may be disposed on the lower side substrate 11B.

3. Third Embodiment of Solid-State Imaging Device

Figure 24:
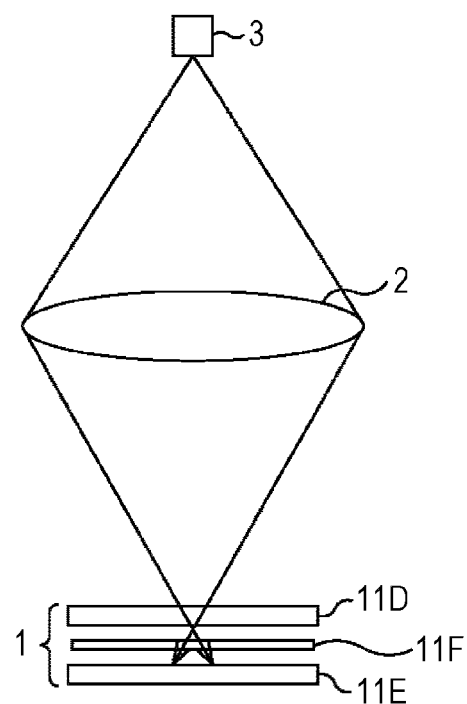
FIG. 24 is a diagram illustrating a solid-state imaging device according to a third embodiment of the present disclosure.

FIG. 24 is a diagram illustrating a solid-state imaging device 1 according to a third embodiment of the present disclosure.

The solid-state imaging device 1 according to the third embodiment is, for example, a combination-type solid-state imaging device in which two semiconductor substrates (silicon substrates) 11D and 11E are laminated through an aperture 11F.

Also in the third embodiment, in a similar manner to the above-mentioned embodiments, of the two semiconductor substrates 11D and 11E, the semiconductor substrate 11D close to the optical lens 2 is referred to as an upper side substrate 11D, and the semiconductor substrate 11E far from the optical lens 2 is referred to as a lower side substrate 11E. Further, if the two semiconductor substrates 11D and 11E are not particularly distinguished, the substrates are simply referred to as substrates 11.

Figure 25:
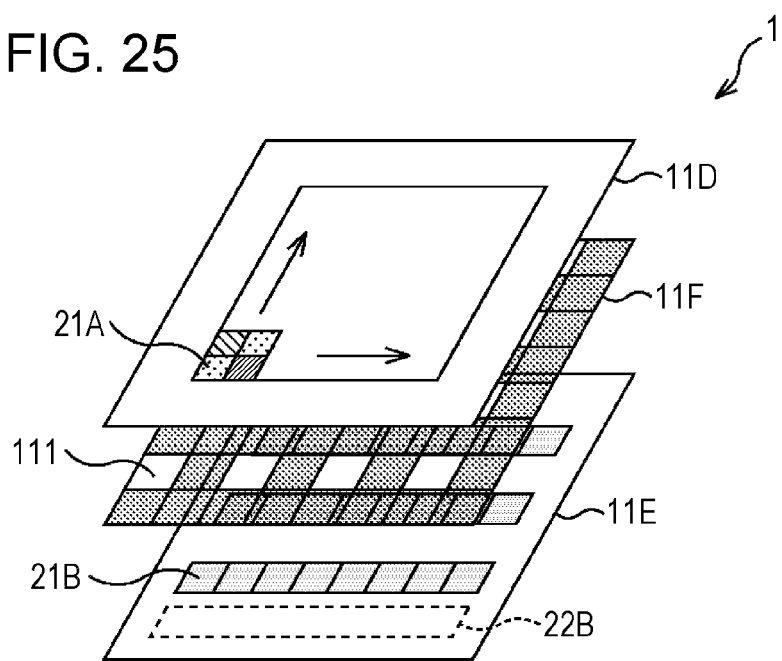
FIG. 25 is a diagram illustrating a schematic configuration of an upper side substrate, a lower side substrate, and an aperture.

FIG. 25 is a diagram illustrating a schematic configuration of the upper side substrate 11D and the lower side substrate 11E of the solid-state imaging device 1.

The plurality of pixels 21A, in which color filters of red (R), green (G), and blue (B) are formed, is arranged on the upper side substrate 11D in a two-dimensional array shape. The color filters formed on the pixels 21A of the upper side substrate 11D are arranged in, for example, a Bayer array, in a similar manner to the first and second embodiments. Accordingly, the upper side substrate 11D may function as a color image sensor that outputs R, G, and B color signals.

The plurality of pixels 21B is formed on the lower side substrate 11E in a shape which corresponds to only some of a plurality of pixel rows formed on the upper side substrate 11D. Contrary to the first and second embodiments, the plurality of pixels 21B formed on the lower side substrate 11E is used for phase difference detection. In a region in which the pixels 21B of the lower side substrate 11E are not formed, a logic circuit 22B is formed, which includes a signal processing circuit that processes signals detected by the pixels 21B of the lower side substrate 11E.

Contrary to the above-mentioned first and second embodiments, as shown in FIG. 25, opening portions 111, each of which has a size the same as the single pixel size of the pixel 21A of the upper side substrate 11D, are formed on the aperture 11F with predetermined spacings.

Figure 26:
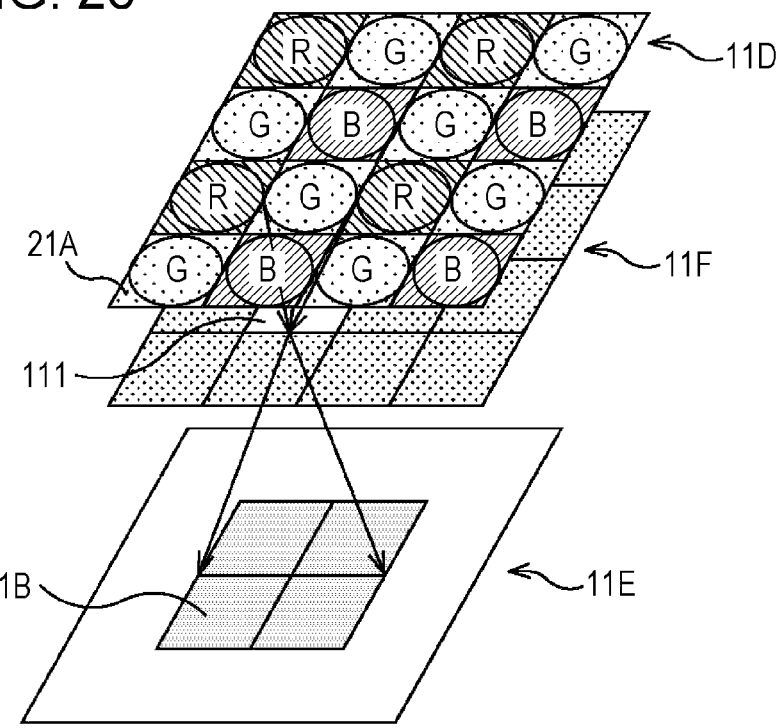
FIG. 26 is a diagram illustrating a relationship between a transmission pixel of the upper side substrate and light receiving pixels of the lower side substrate.

As shown in FIG. 26, the incident light, which passes through a single pixel (hereinafter referred to as a transmission pixel) of the upper side substrate 11D corresponding to the opening portion 111 of the aperture 11F, is incident on 4 pixels of 2×2 pixels of the lower side substrate 11E.

The pixels 21B of the lower side substrate 11E are the phase difference detection pixels. Therefore, the incident light, which passes through the transmission pixel of the upper side substrate 11D, may be received by a plurality of pixels. For example, as shown in FIG. 27, the light may be incident on 16 pixels of 4×4 pixels.

Figure 27:
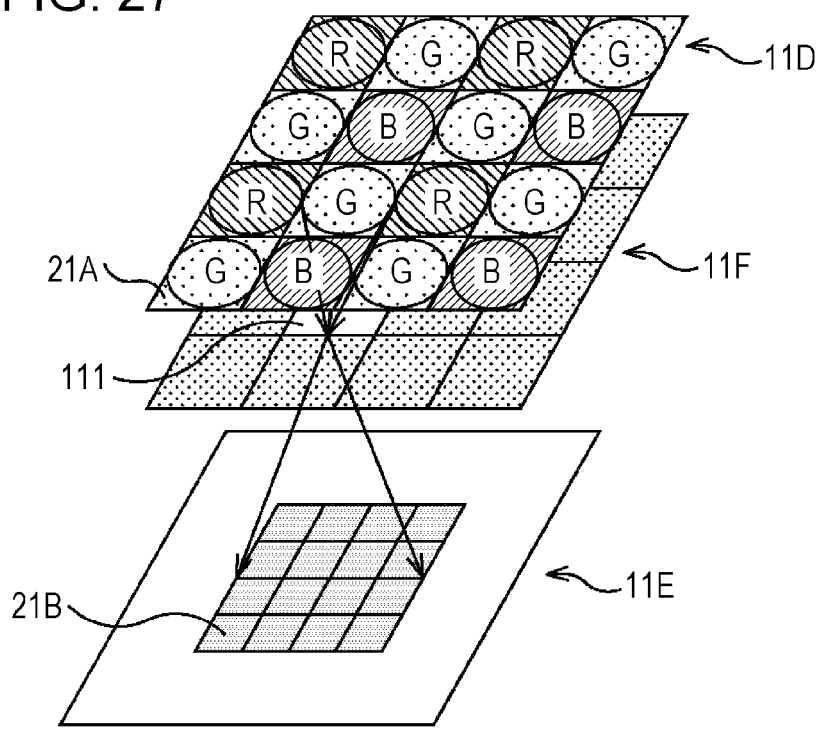
FIG. 27 is a diagram illustrating a relationship between the transmission pixel of the upper side substrate and light receiving pixels of the lower side substrate.

In addition, FIGS. 26 and 27 are diagrams illustrating relationships between the transmission pixel of the upper side substrate 11D and the light receiving pixels of the lower side substrate 11E that receive the incident light from the transmission pixel. In the drawings, the scales of the pixel sizes of the upper side substrate 11D and the lower side substrate 11E are different.

In the image plane phase difference sensor in which the phase difference pixels are disposed on a part of an image sensor having a single-layer structure other than a multilayer structure, a light concentration point of the micro lens is ideally on the photodiode surface of the silicon layer, but practically deep inside the silicon layer. Hence, the light concentration point for imaging is different from the light concentration point for phase difference detection. Thus, there is a problem in that it is difficult to optimize the micro lens.

Accordingly, in the solid-state imaging device 1 according to the third embodiment, the phase difference detection pixels are disposed on the lower side substrate 11E. Thereby, even in a state where a curvature of the micro lens is optimized for the pixels 21A of the upper side substrate 11D for imaging, it is possible to maximize separation performance of the phase difference pixels.

Further, when the incident light passing through a single pixel of the upper side substrate 11D is received by a plurality of pixels having a size larger than that of 2×2, it is possible to perform multi-view separation, and thus it is possible to increase performance of autofocus.

Figure 28:
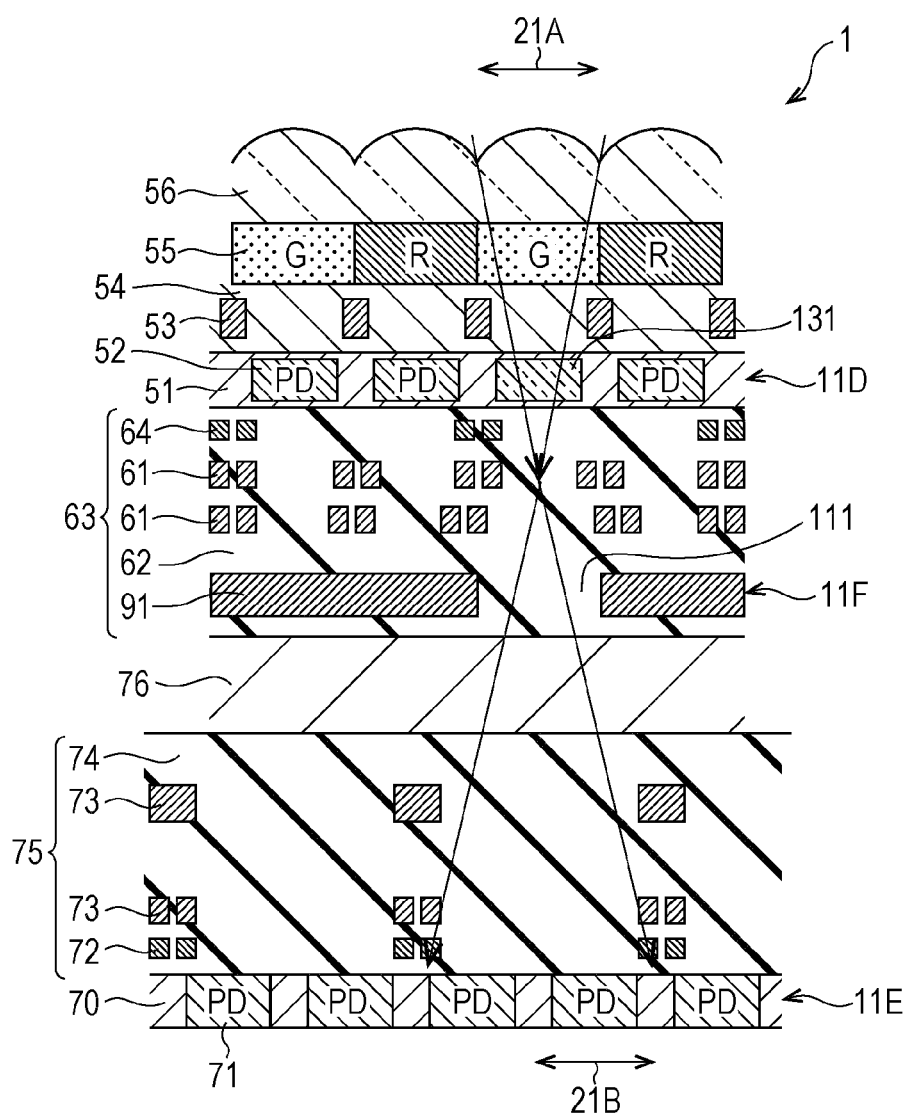
FIG. 28 is a first cross-sectional configuration diagram of the solid-state imaging device according to the third embodiment.

FIG. 28 is a cross-sectional configuration diagram of the solid-state imaging device 1 according to the third embodiment.

The upper side substrate 11D, the lower side substrate 11E, and the aperture 11F in FIG. 28 correspond to the upper side substrate 11A, the lower side substrate 11B, and the aperture 11C of FIG. 15. The corresponding elements are represented by the same reference numerals and signs, and thus only a configuration different from that of FIG. 15 will be hereinafter described.

Instead of the photodiode 52, a transparent layer 131, which does not absorb light, is formed on the silicon layer 51 of the transmission pixel of the upper side substrate 11D. The light originating from the object 3 is incident on the photodiodes 71 of the lower side substrate 11E through the on-chip lens 56, the color filters 55, the transparent layer 131, and the opening portion 111 of the aperture 11F. The transparent layer 131 can be formed of, for example, SiO2, which is oxidized silicon (Si), or the like.

As described with reference to FIG. 5, when the photodiode 52 is formed on the silicon layer 51 of the upper side substrate 11D, only a half of the amount of the incident light with the long wavelength is transmitted. Therefore, instead of the photodiode 52, by using the transparent layer 131 which does not absorb light, it is possible to make light with all wavelengths reach the lower side substrate 11E.

The pixel signal of the pixel 21A of the upper side substrate 11D, in which the transparent layer 131 is formed, is obtained through interpolation between the pixel signals of adjacent pixels. In addition, even when the photodiode 52 is formed, the intensity is weak but is at the level at which light can be received. Therefore, the photodiode 52 may be provided without change.

Also in the third embodiment, as shown in FIG. 14 of the second embodiment, the aperture 11F may be formed as the glass layer 81 on which the light blocking pattern 81P is deposited.

Figure 29:
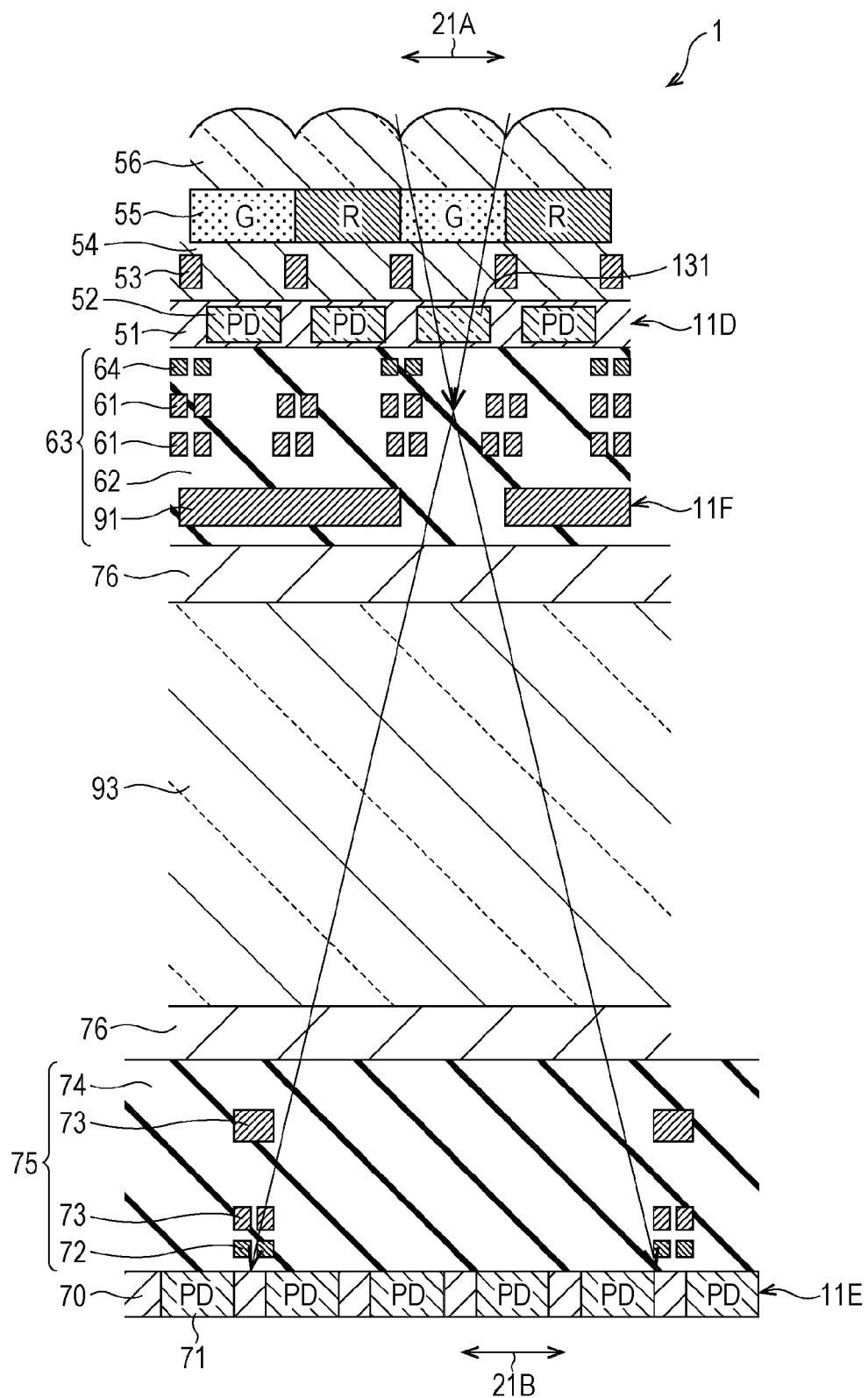
FIG. 29 is a cross-sectional configuration diagram of the solid-state imaging device.

Further, as shown in FIG. 29, by inserting a glass layer as the intermediate layer 93, the upper side substrate 11D and the lower side substrate 11E are separated at an appropriate distance. Thereby, for example, points of view of the incident light, which passes through the transmission pixel of the upper side substrate 11D, can be increased from 4 pixels of 2×2 pixels such that the light is incident, in an area of 16 pixels of 4×4 pixels, on the lower side substrate 11E. By increasing points of view, resolution in the distance direction is improved. As a result, it is possible to improve distance measurement performance.

However, when the number of light receiving pixels of the lower side substrate 11E corresponding to the transmission pixel of the upper side substrate 11D is set to be large, it is necessary to increase the spacing of the transmission pixels of the upper side substrate 11D without color mixture. Hence, thinning increases.

As a method of thinning, in a case where the color array of the upper side substrate 11D is the Bayer array, when the transmission pixels are disposed on the upper side substrate 11D with a pixel pitch which is an even number times the pixel size, the pixels with the same color are formed as the transmission pixels. As a result, it is possible to obtain monochrome information from the lower side substrate 11E.

In contrast, when the transmission pixels are disposed on the upper side substrate 11D with a pixel pitch which is an odd number times the pixel size, the color array of the transmission pixels is formed as the Bayer array. As a result, it is possible to obtain color information from the lower side substrate 11E.

Figure 30:
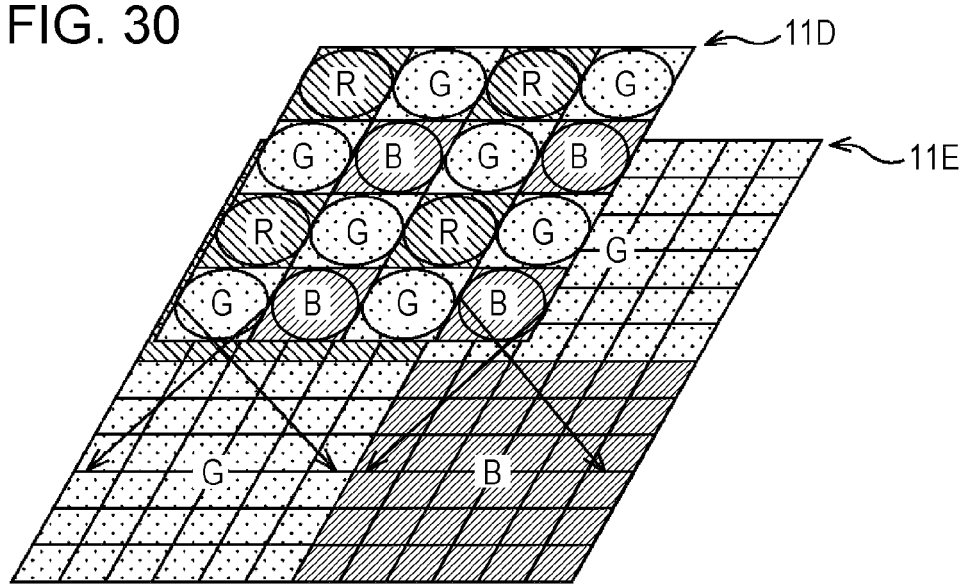
FIG. 30 is a diagram illustrating a schematic configuration of an upper side substrate and a lower side substrate.

FIG. 30 shows an example in which the transmission pixels are disposed at a 3-pixel pitch which is an odd number times the pixel size such that the incident light, which passes through one transmission pixel of the upper side substrate 11D, is received by 36 pixels of 6×6 pixels on the lower side substrate 11E.

In this exemplary case, image information of the Bayer array, in which 36 pixels of 6×6 pixels are arranged on a color-by-color basis, can be obtained from the lower side substrate 11E. Therefore, by re-synthesizing signals obtained by the lower side substrate 11E, a captured image may be generated.

Figure 31:
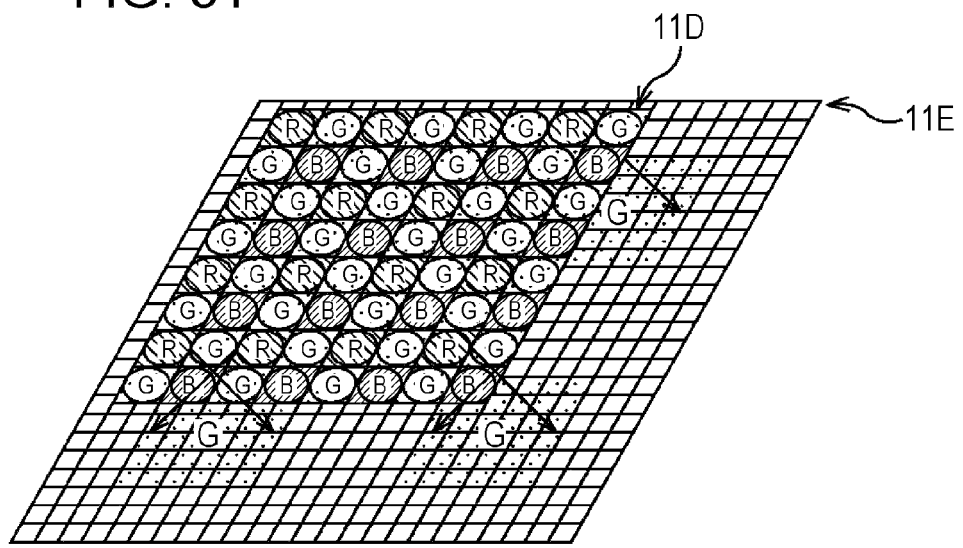
FIG. 31 is a diagram illustrating a schematic configuration of an upper side substrate and a lower side substrate.

FIG. 31 shows an example in which the transmission pixels are disposed at a 6-pixel pitch which is an even number times the pixel size such that the incident light, which passes through one transmission pixel of the upper side substrate 11D, is received by 36 pixels of 6×6 pixels on the lower side substrate 11E.

In this exemplary case, the transmission pixels of the upper side substrate 11D are the G pixels, and thus the lower side substrate 11E also receives all the G signals. The color pixel of the transmission pixel may be any one of the R, G, and B pixels. However, as described above, in terms of human sensitivity characteristics or the like, it is preferable that the transmission pixels be disposed on the G pixels so as to perform focus control.

As described above, depending on which positions (pitch) the transmission pixels of the upper side substrate 11D are at, or depending on which pixels of the lower side substrate 11E receive the light passing through the transmission pixels, it is possible to appropriately use the number of points of view in the phase difference detection or image information types (color and monochrome) obtained by the lower side substrate 11E.

In addition, through the thinning, a logic circuit 22B can be disposed in a redundant region in which the pixels 21B for phase difference detection are not formed on the lower side substrate 11E.

Further, in a case where an imaging apparatus having the solid-state imaging device 1 has an optical zooming function, when a focal length is changed through optical zooming, an incident angle of light is changed by an image height. Hence, the pixel region of the lower side substrate 11E, in which the light passing through the transmission pixels of the upper side substrate 11D is received, is changed.

Figure 32:
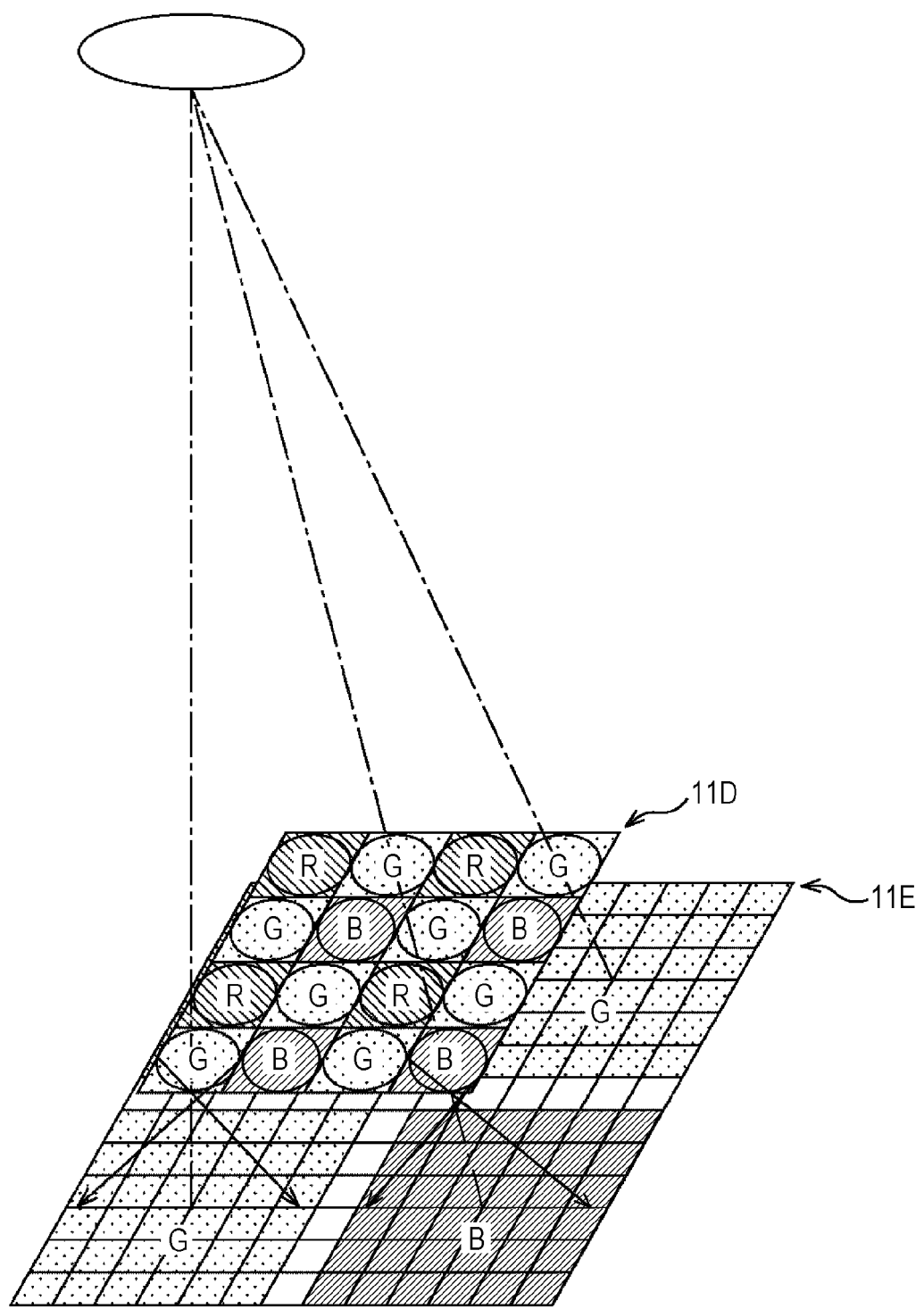
FIG. 32 is a diagram illustrating a state where a focal length is changed by optical zooming.
Figure 33:
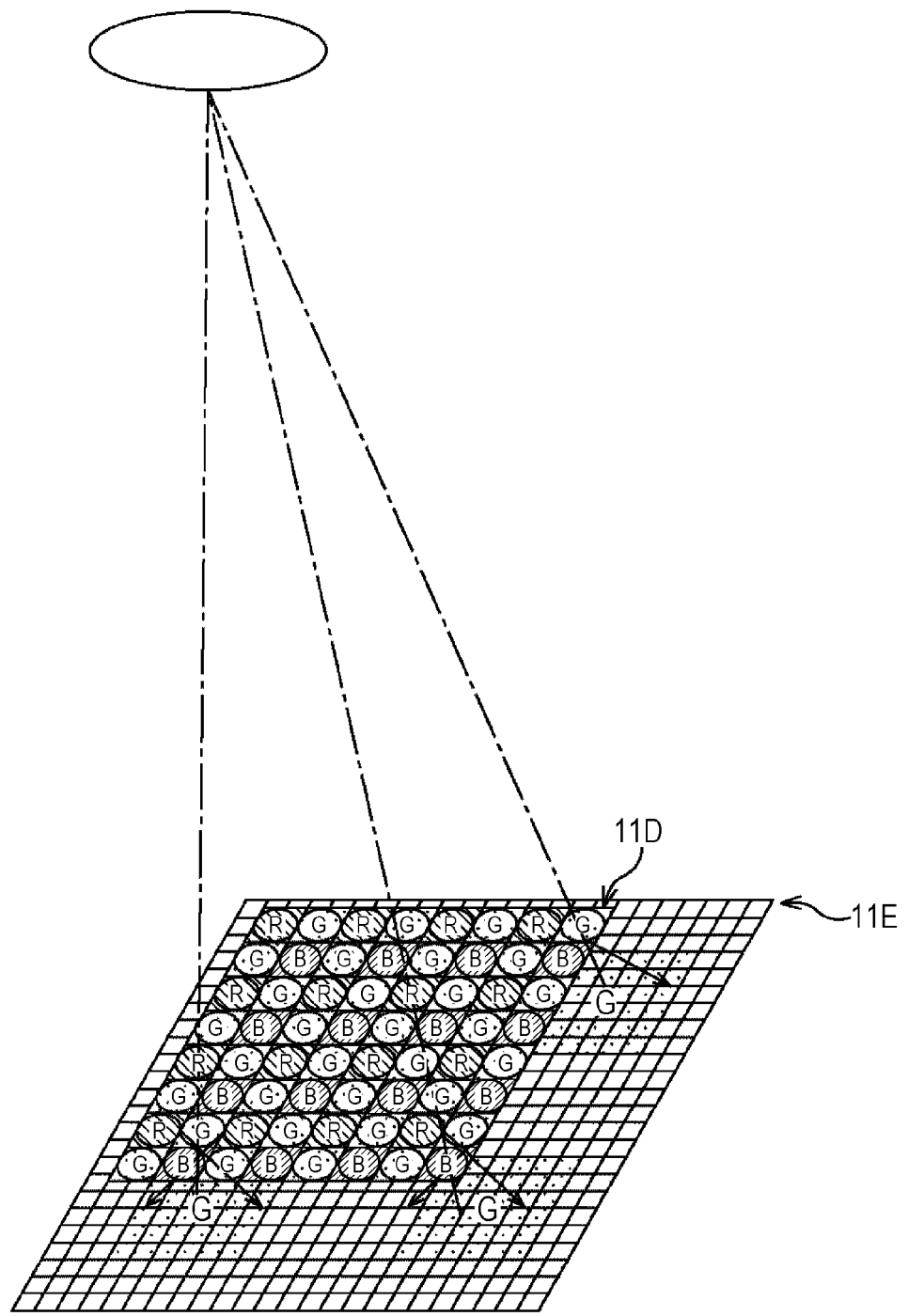
FIG. 33 is a diagram illustrating a state where a focal length is changed by optical zooming.

For example, FIG. 32 shows a state where a focal length is shortened compared with the state shown in FIG. 30, and FIG. 33 shows a state where a focal length is shortened compared with the state shown in FIG. 31.

In either one of FIGS. 32 and 33, the pixel region of the lower side substrate 11E, in which the light passing through the transmission pixels of the upper side substrate 11D is received, is changed compared with FIGS. 30 and 31.

As described above, in the case where the imaging apparatus having the solid-state imaging device 1 has the optical zooming function, the pixel region of the lower side substrate 11E is changed through optical zooming. Consequently, even when a redundant region is generated through thinning, since there is the redundant region, there may be advantages in that it is possible to cope with the change of the pixel region of the lower side substrate 11E caused by optical zooming and thus it becomes easy to perform signal processing.

Modification Examples of Third Embodiment

Figure 34:
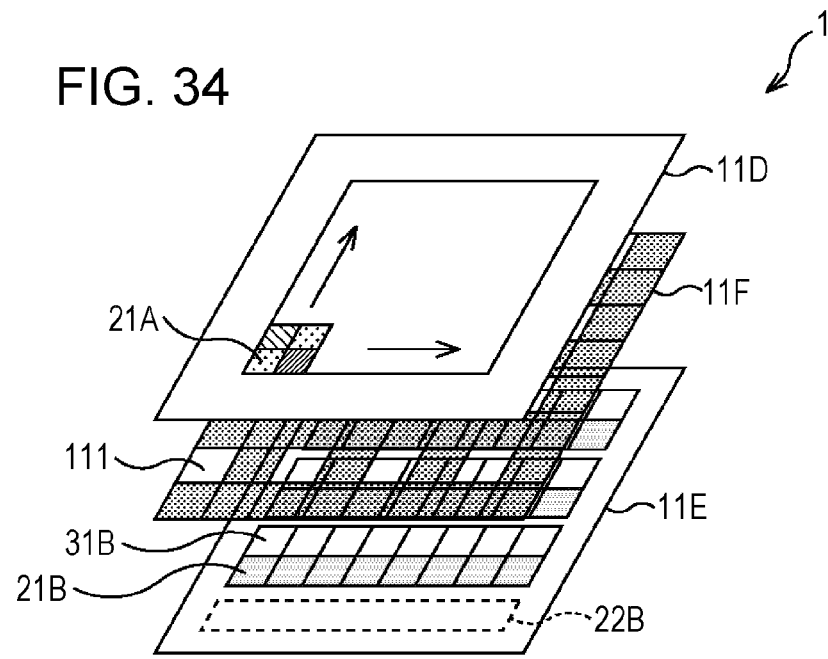
FIG. 34 is a diagram illustrating a modification example in which an exposure control sensor is added.

Modification examples of the third embodiment of the solid-state imaging device will be described.
Addition of Exposure Control Sensor Also in the solid-state imaging device 1 according to the third embodiment, in a similar manner to the above-mentioned first and second embodiments, as shown in FIG. 34, the plurality of pixels 31B as an exposure control detection sensor can be formed in a region in which the plurality of phase difference detection pixels 21B of the lower side substrate 11E is not formed.

Figure 35:
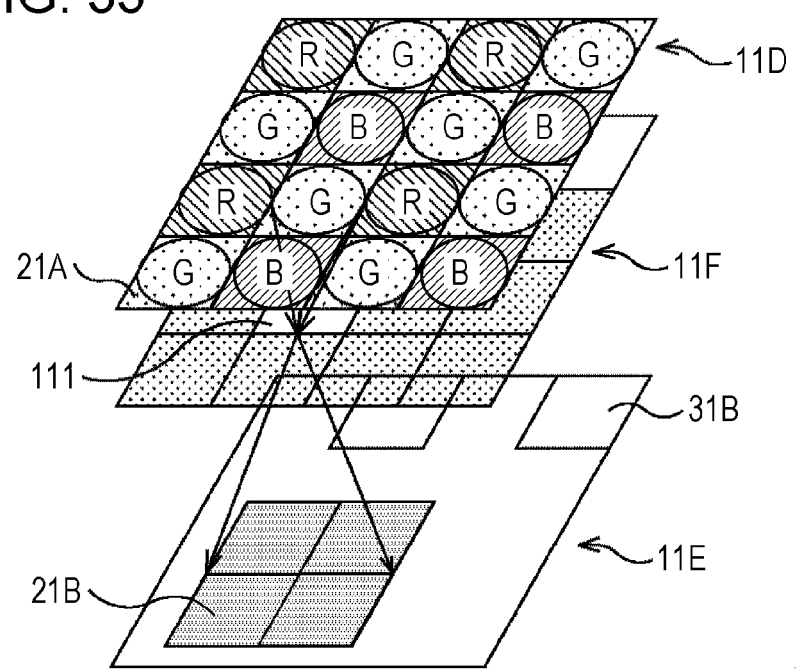
FIG. 35 is a diagram illustrating a modification example in which an exposure control sensor is added.

FIG. 35 shows an example in which a plurality of exposure control pixels 31B is disposed in a configuration in which the incident light passing through one transmission pixel of the upper side substrate 11D shown in FIG. 26 is incident on 4 pixels of 2×2 pixels of the lower side substrate 11E.

Figure 36:
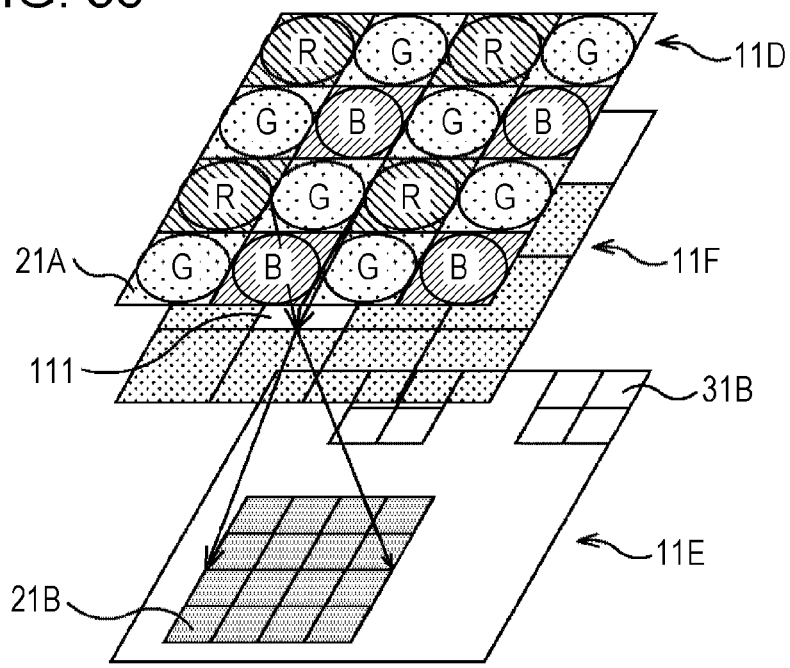
FIG. 36 is a diagram illustrating a modification example in which an exposure control sensor is added.

FIG. 36 shows an example in which a plurality of exposure control pixels 31B is disposed in a configuration in which the incident light passing through one transmission pixel of the upper side substrate 11D shown in FIG. 27 is incident on 16 pixels of 4×4 pixels of the lower side substrate 11E.

In the solid-state imaging device 1 according to the third embodiment, an exposure control signal is detected by the plurality of pixels 31B provided on the lower side substrate 11E different from the image sensor of the upper side substrate 11D. Further, since the pixels 21B and 31B are driven on a row-by-row basis, the driving can be performed by setting timing of exposure and reading of the plurality of exposure control pixels 31B separately from the plurality of phase difference detection pixels 21B. Therefore, it is possible to perform exposure control at a high speed, and thus it is possible to instantly perform appropriate exposure of the image sensor of the upper side substrate 11D.
Addition of Contrast Detection Sensor In a region in which the plurality of phase difference detection pixels 21B of the lower side substrate 11E of the solid-state imaging device 1 according to the third embodiment is not formed, a plurality of pixels as a contrast focus detection sensor may be formed. In this case, it is possible to implement hybrid type autofocus capable of performing focus control according to the contrast method and focus control according to the phase difference method. The focus control according to the contrast method is performed using the signal, which is obtained by the image sensor of the upper side substrate 11D, and the signal which is obtained by the contrast focus detection sensor of the lower side substrate 11E. The focus control according to the phase difference method is performed using the signal which is obtained by the plurality of phase difference detection pixels 21B of the lower side substrate 11E.

Figure 37:
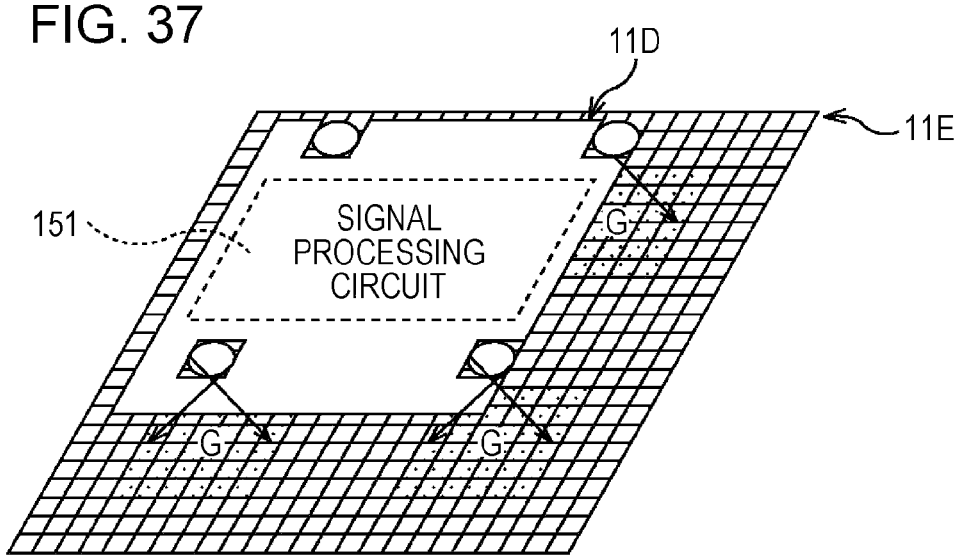
FIG. 37 is a diagram illustrating a modification example of the solid-state imaging device according to the third embodiment.

Further, in a region in which the plurality of phase difference detection pixels 21B of the lower side substrate 11E of the solid-state imaging device 1 according to the third embodiment is not formed, both the contrast focus detection sensor and the exposure control detection sensor may be disposed.
Example of Logic Circuit of Upper Side Substrate In the above-mentioned third embodiment, the plurality of pixels 21A as an image generation detection sensor (image sensor) is disposed on the upper side substrate 11D, but it is conceivable that, in some cases, a 2-dimensional image may not be necessary. In this case, as shown in FIG. 37, on the upper side substrate 11D, the plurality of pixels 21A is not formed, and a signal processing circuit 151, such as a logic circuit and a memory circuit, can be formed. The signal processing circuit 151 processes a phase difference detection signal obtained by the plurality of pixels 21B of the lower side substrate 11E.

Figure 38:
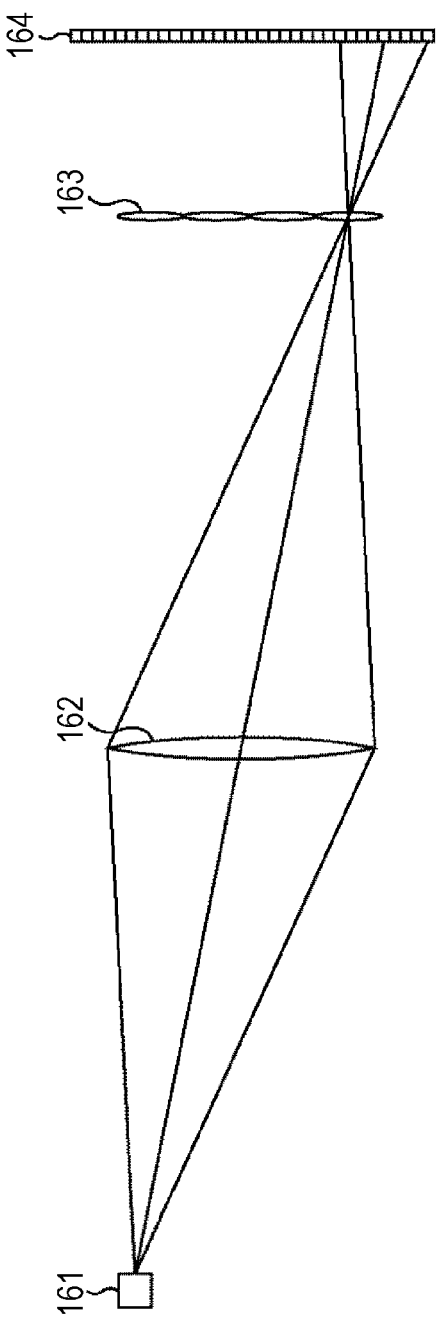
FIG. 38 is a diagram illustrating a modification example of the solid-state imaging device according to the third embodiment.

In a general multi-view light field camera, as shown in FIG. 38, a micro lens array 163 is provided between a main lens 162 and an image sensor 164, and the light originating from the object 161 is firstly imaged on the micro lens array 163 through the main lens 162.

Figure 39:
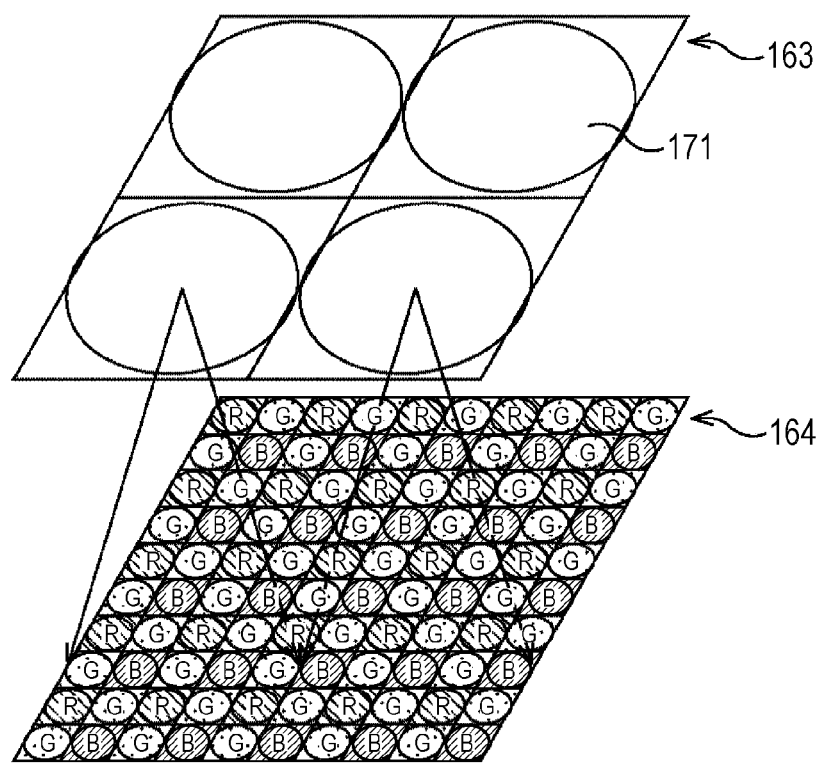
FIG. 39 is a diagram illustrating a modification example of the solid-state imaging device according to the third embodiment.

In the micro lens array 163, as shown in FIG. 39, micro lenses 171, each of which has a large lens diameter, are disposed with small gaps interposed between adjacent lenses. In this case, the spacing between the micro lens array 163 and the image sensor 164 is several mm, and thus it is difficult for the micro lenses 171 having large lens diameters to be formed in a semiconductor process. Further, the micro lenses 171 having large lens diameters are formed as a cemented lens, and thus the cementing management is difficult.

In contrast, in the structure of the solid-state imaging device 1 shown in FIG. 37, each of on-chip lenses formed on the transmission pixels of the upper side substrate 11D has a pixel size of an image sensor which can be manufactured in the semiconductor process. In this case, the spacing between the upper side substrate 11D and the lower side substrate 11E can be set as a distance which can be formed through bonding of the semiconductor substrates, and thus high precision alignment in the semiconductor process can be performed.

The above-mentioned embodiments described a structure of the solid-state imaging device 1 in which the semiconductor substrate 11A (11D) having the silicon layer 51 as a photoelectric conversion layer and the semiconductor substrate 11B (11E) having the silicon layer 70 as a photoelectric conversion layer are laminated.

The semiconductor substrate 11A (11D) and the semiconductor substrate 11B (11E) may be bonded in a wafer state, and may be bonded in a semiconductor chip state after dicing of the wafer.

Further, the laminated photoelectric conversion layer may be formed of, for example, a compound semiconductor having a chalcopyrite structure or an organic photoelectric conversion film. Further, the photoelectric conversion layer may be three or more laminated layers.

Example of Combination of Upper and Lower Substrates of Third Embodiment

In the above-mentioned embodiment, the semiconductor substrate 11A (11D) is formed as a back side illumination type, and the semiconductor substrate 11B (11E) is formed as a front side illumination type. However, either one of the semiconductor substrate 11A (11D) and the semiconductor substrate 11B (11E) may be either one of the back side illumination type and the front side illumination type.

In the description of the third embodiment, in the cross-sectional configuration of the solid-state imaging device 1 shown in FIG. 28, a description is given of a configuration example in which the upper side substrate 11D as the back side illumination type and the lower side substrate 11E as the front side illumination type are laminated. However, other combination examples will be described with reference to FIGS. 40 to 42.

Figure 40:
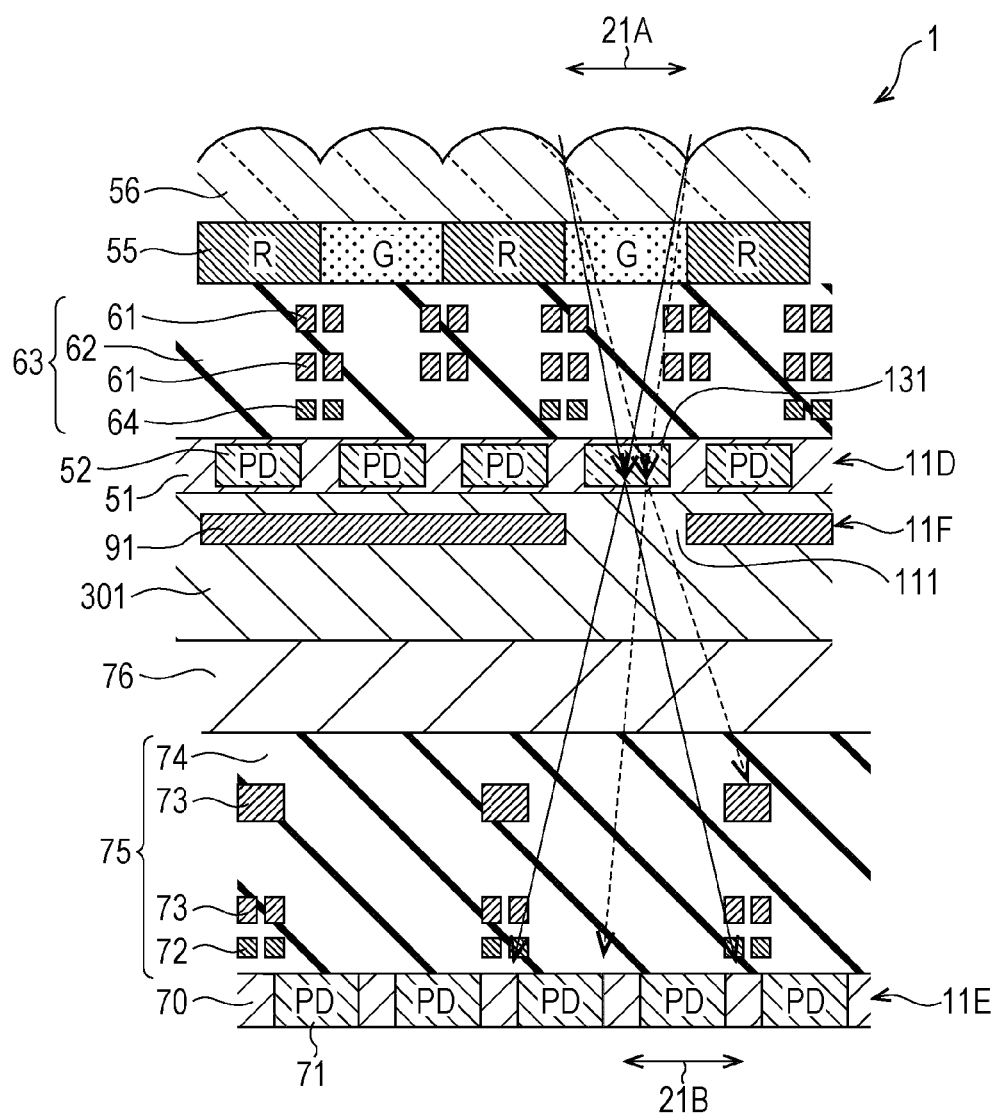
FIG. 40 is a second cross-sectional configuration diagram of the solid-state imaging device according to the third embodiment.
Figure 41:
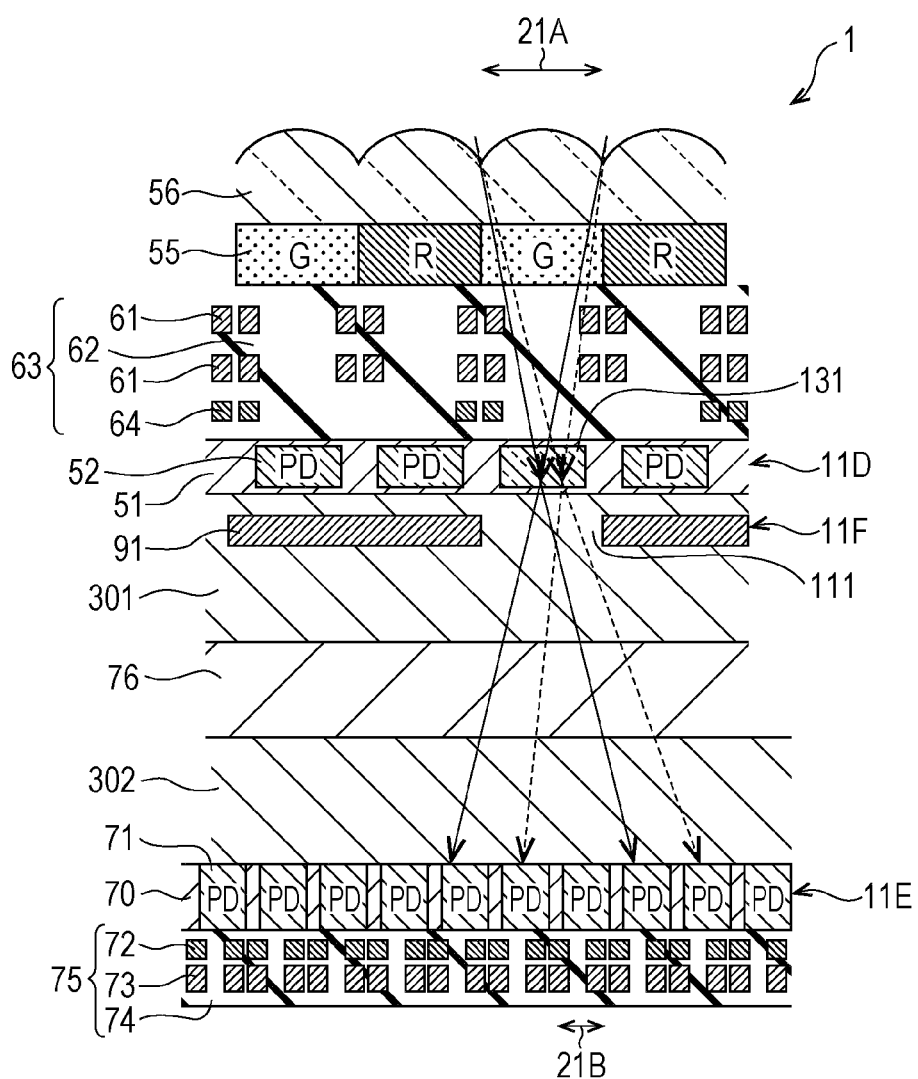
FIG. 41 is a third cross-sectional configuration diagram of the solid-state imaging device according to the third embodiment.
Figure 42:
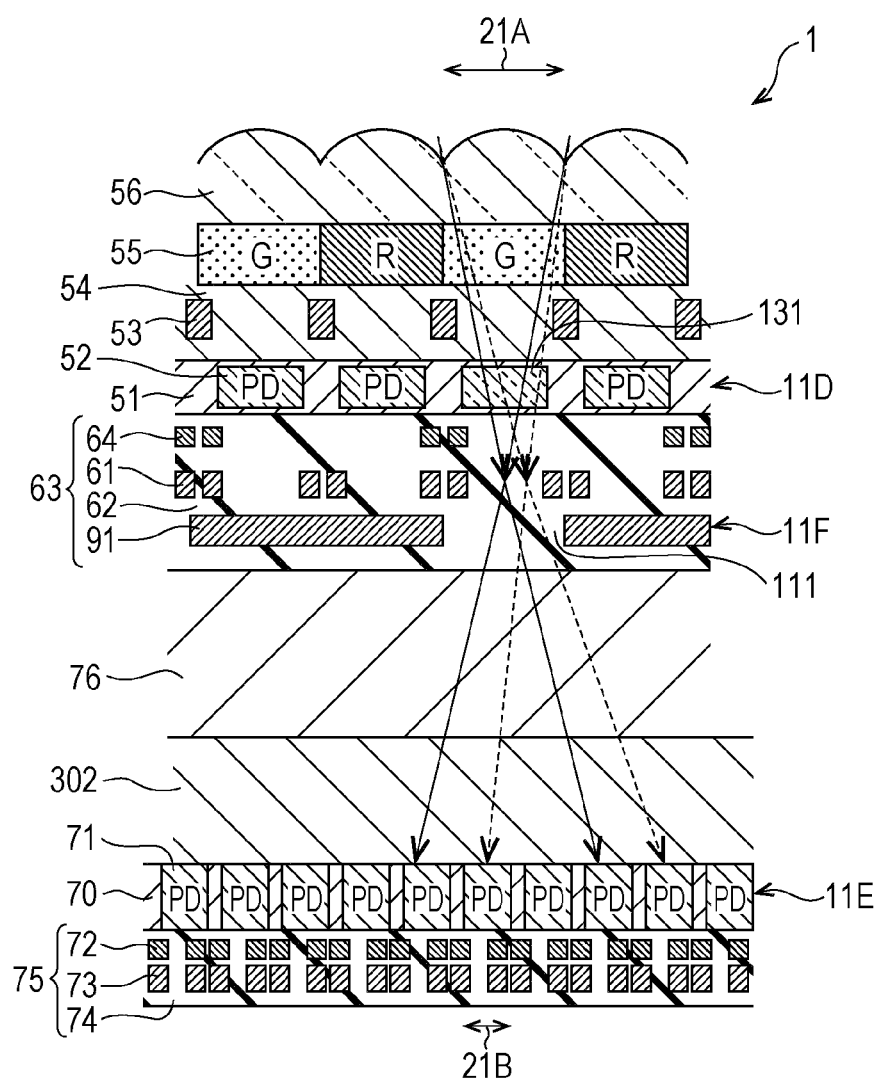
FIG. 42 is a fourth cross-sectional configuration diagram of the solid-state imaging device according to the third embodiment.

In FIGS. 40 to 42, elements corresponding to those of FIG. 28 are represented by the same reference numerals and signs, and thus a description thereof will be appropriately omitted.

FIG. 40 is a cross-sectional configuration diagram of the solid-state imaging device 1, in which both the upper side substrate 11D and the lower side substrate 11E are laminated as the front side illumination types, according to the third embodiment.

Since the upper side substrate 11D is the front side illumination type, the color filters 55 and the on-chip lens 56 are formed on the multilevel wiring layer 63 which is formed on the upper side of the silicon layer 51 having the photodiodes 52 formed therein. The wiring layer 91 as the aperture 11F is formed on the back side of the silicon layer 51, that is, a side thereof facing the lower side substrate 11E. The wiring layer 91 is covered with a protective film 301.

Further, since the lower side substrate 11E is also the front side illumination type, the lower side substrate 11E and the upper side substrate 11D are bonded with the protective film 76 interposed therebetween such that the multilevel wiring layer 75, which is formed on the upper side of the silicon layer 70 having the photodiodes 71 formed therein, faces the upper side substrate 11D.

FIG. 41 is a cross-sectional configuration diagram of the solid-state imaging device 1, in which the upper side substrate 11D is laminated as the front side illumination type and the lower side substrate 11E is laminated as the back side illumination type, according to the third embodiment.

Since the upper side substrate 11D is the front side illumination type, the color filters 55 and the on-chip lens 56 are formed on the multilevel wiring layer 63 which is formed on the upper side of the silicon layer 51 having the photodiodes 52 formed therein. The wiring layer 91 as the aperture 11F is formed on the back side of the silicon layer 51, that is, a side thereof facing the lower side substrate 11E. The wiring layer 91 is covered with the protective film 301.

In contrast, since the lower side substrate 11E is the back side illumination type, the lower side substrate 11E and the upper side substrate 11D are bonded with protective films 302 and 76 interposed therebetween such that a side of the lower side substrate 11E opposite to the multilevel wiring layer 75 formed on the silicon layer 70 faces the upper side substrate 11D.

FIG. 42 is a cross-sectional configuration diagram of the solid-state imaging device 1, in which both the upper side substrate 11D and the lower side substrate 11E are laminated as the back side illumination types, according to the third embodiment.

Since the upper side substrate 11D is the back side illumination type, the light blocking film 53, the planarizing film 54, the color filters 55, and the on-chip lens 56 are formed on the side (back side) of the upper side substrate 11D opposite to the multilevel wiring layer 63 formed on the silicon layer 51.

Since the lower side substrate 11E is also the back side illumination type, the lower side substrate 11E and the upper side substrate 11D are bonded with the protective films 302 and 76 interposed therebetween such that a side of the lower side substrate 11E opposite to the multilevel wiring layer 75 formed on the silicon layer 70 faces the upper side substrate 11D.

FIGS. 28 and 40 to 42 show all combinations of the front side illumination type or the back side illumination type in a case of bonding the upper side substrate 11D and the lower side substrate 11E.

FIGS. 28 and 40 correspond to examples in which the incident light passing through the transmission pixel is incident on 4 pixels of 2×2 pixels of the lower side substrate 11E as shown in FIG. 26.

FIGS. 41 and 42 correspond to examples in which the incident light passing through the transmission pixel is incident on 16 pixels of 4×4 pixels of the lower side substrate 11E as shown in FIG. 27.

As shown in FIGS. 40 and 41, when the upper side substrate 11D is formed as the front side illumination type, the wiring layers 61 also serve as a light blocking film, and thus the light blocking film 53, which is provided in the case of the back side illumination type, is not necessary. Hence, the height (thickness) from the on-chip lens 56 to the aperture 11F can be minimized, and thus a large amount of obliquely incident light, which is indicated by the arrow of the dashed line, is also received in the photodiodes 71 of the lower side substrate 11E. That is, when the upper side substrate 11D is formed as the front side illumination type, it is possible to improve properties of obliquely incident light.

As shown in FIGS. 41 and 42, when the lower side substrate 11E is formed as the back side illumination type, a side of the lower side substrate 11E facing the multilevel wiring layer 75 is set as the lower side in the drawing. Hence, there is nothing to block the light which passes through the opening portion 111 of the aperture 11F and is incident on the photodiodes 71 of the lower side substrate 11E. Thereby, it is possible to further improve the light reception sensitivities of the photodiodes 71 of the lower side substrate 11E.

In addition, in FIGS. 28 and 40 to 42, instead of the photodiode 52, the transparent layer 131, which totally transmits the incident light, is formed in the region of the silicon layer 51 corresponding to the transmission pixel. However, in a similar manner to other pixels 21A, the photodiode 52 may be provided without change as described above.

Example of R Pixel as Transmission Pixel

Meanwhile, as shown in FIGS. 26 and 27, the above-mentioned third embodiment described the example in which the G pixel is formed as the transmission pixel. However, as described above, the color pixel of the transmission pixel may be any one of the R pixel, the G pixel, and the B pixel. For example, focusing on human sensitivity characteristics or the like, as described above, it is preferable that the G pixel be formed as the transmission pixel.

Meanwhile, when the G pixel is formed as the transmission pixel, the G pixels in the Bayer array are disposed in a checkered pattern form. As shown in FIGS. 26 and 27, the light, which passes through one transmission pixel of the upper side substrate 11D, is received by the plurality of pixels of the lower side substrate 11E. Hence, it is necessary for the spacing between the transmission pixels of the upper side substrate 11D to be increased to correspond to the light receiving pixels of the lower side substrate 11E.

Figure 43:
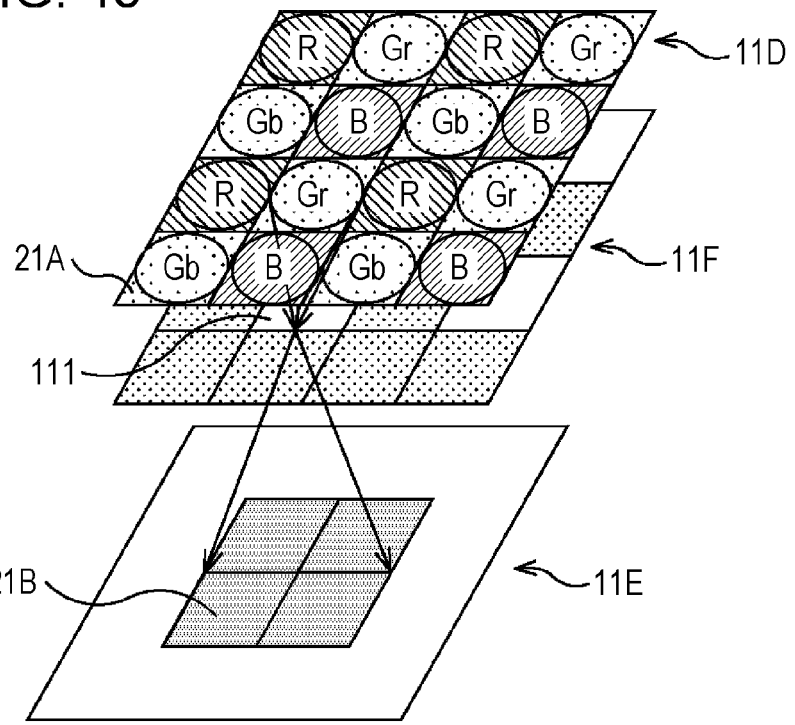
FIG. 43 is a diagram illustrating an example in which a G pixel is formed as a transmission pixel.

Hence, the G pixels are not entirely formed as the transmission pixels. The G pixels include G pixels (hereinafter referred to as Gr pixels) disposed in the same rows as the R and G pixels (hereinafter referred to as Gb pixels) disposed in the same rows as the B pixels. For example, as shown in FIG. 43, only the Gr pixels are set as the transmission pixels.

In this case, the opening portions 111 of the aperture 11F are provided under the Gr pixels. Thus, the light, which is incident into the Gr pixels, is transmitted to the lower side substrate 11E, but the light, which is incident into the Gb pixels, is reflected by the aperture 11F since the opening portions 111 are not formed below the Gb pixels. Consequently, there is a concern that there may be difference in light receiving characteristics between the Gr pixels and the Gb pixels in accordance with whether or not the aperture 11F is present.

In contrast, when the R pixels are formed as the transmission pixels, there is no concern that the difference in the light receiving characteristics may occur like the case where the G pixels are formed as the transmission pixels.

Figure 44:
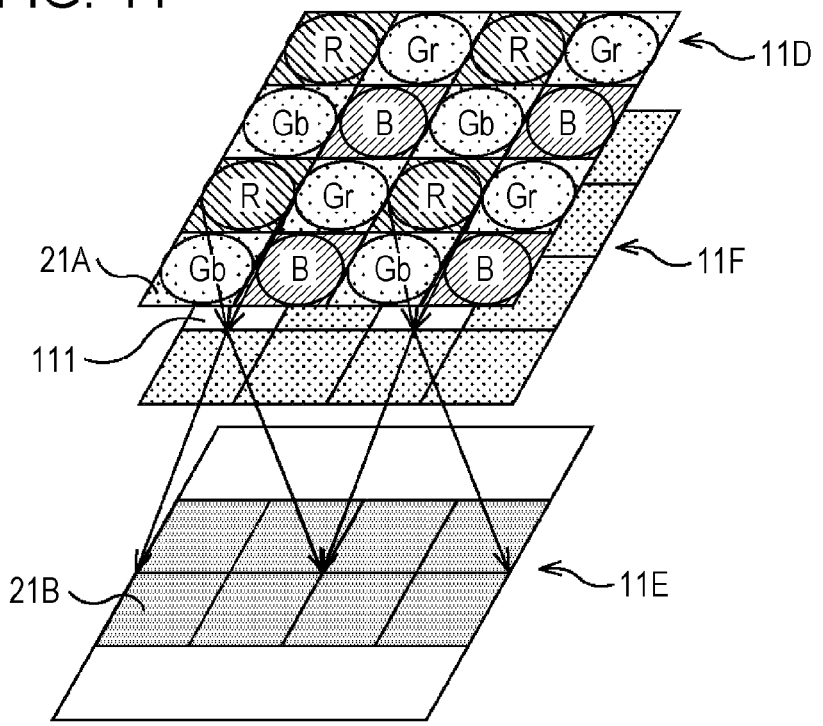
FIG. 44 is a diagram illustrating an example in which R pixels are formed as transmission pixels.
Figure 45:
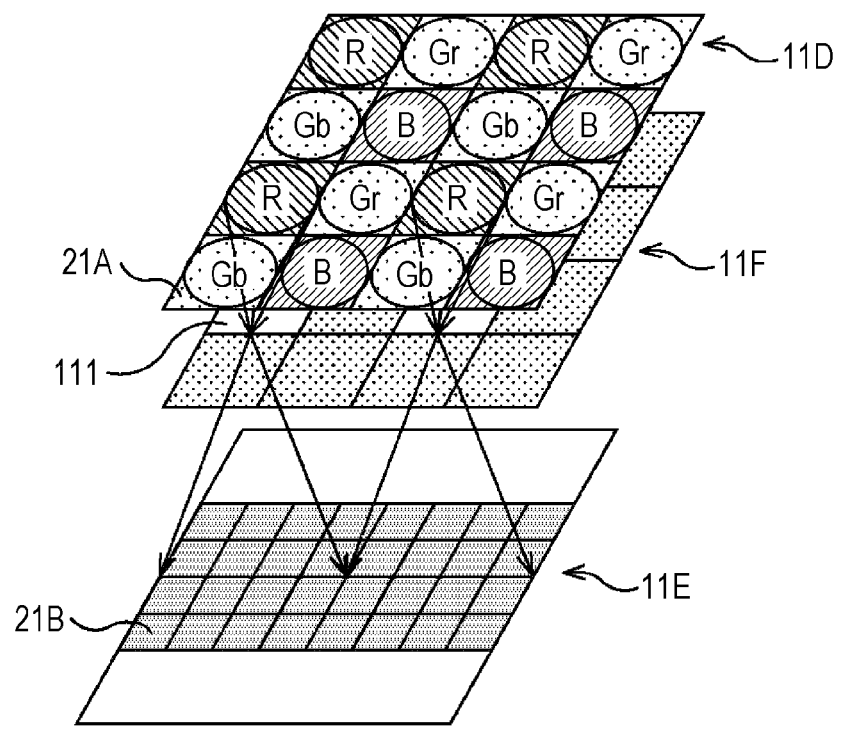
FIG. 45 is a diagram illustrating an example in which R pixels are formed as transmission pixels.

FIGS. 44 and 45 show examples in which the R pixels are formed as the transmission pixels in the above-mentioned third embodiment.

FIG. 44 shows an example in which the R pixels are formed as the transmission pixels and the incident light passing through the transmission pixels is incident on 4 pixels of 2×2 pixels of the lower side substrate 11E.

FIG. 45 shows an example in which the R pixels are formed as the transmission pixels and the incident light passing through the transmission pixels is incident on 16 pixels of 4×4 pixels of the lower side substrate 11E.

When the R pixels are formed as the transmission pixels, in the Bayer array, the arrangement spacing of the R pixels is larger than that of the G pixels. Hence, all the R pixels are formed as the transmission pixels, and thus it is possible to prevent the difference, which is problematic, in the light receiving characteristics between the same color pixels from occurring as in the G pixels.

4. Fourth Embodiment of Solid-State Imaging Device

Figure 46:
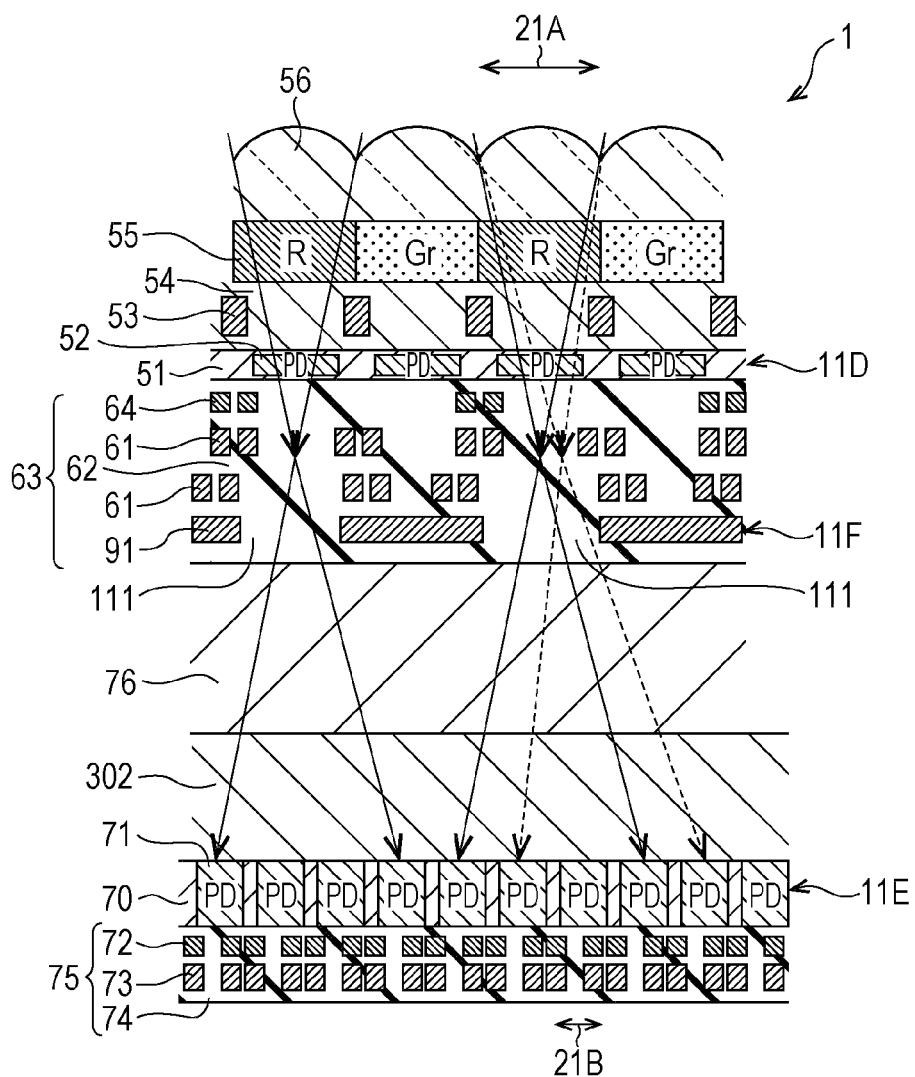
FIG. 46 is a cross-sectional configuration diagram of the solid-state imaging device according to a fourth embodiment.

FIG. 46 is a cross-sectional configuration diagram illustrating a solid-state imaging device 1 according to a fourth embodiment of the present disclosure.

In the solid-state imaging device 1 according to the fourth embodiment, as shown in FIGS. 44 and 45, by providing the opening portions 111 of the aperture 11F below the R pixels, the R pixels are formed as the transmission pixels.

Further, in the solid-state imaging device 1 according to the fourth embodiment, in the silicon layer 51 of the transmission pixels of the upper side substrate 11D, instead of the transparent layer 131, the photodiodes 52 are formed. However, a thickness of the silicon layer 51 in the fourth embodiment is formed to be less than a thickness thereof in the above-mentioned third embodiment.

That is, in the configuration of the solid-state imaging device 1 according to the fourth embodiment, the photodiodes 52 are formed even in the R pixels as the transmission pixels of the upper side substrate 11D, and the pixel signal can be acquired by all the pixels of the upper side substrate 11D.

Further, in the configuration of the solid-state imaging device 1 according to the fourth embodiment, by thinning the silicon layer 51 of the upper side substrate 11D, an amount of light transmitted through the photodiodes 52 is adjusted.

The other configuration of the solid-state imaging device 1 of FIG. 46 is the same as the configuration thereof in the third embodiment, and a description thereof will be omitted.

In addition, in the configuration example of the solid-state imaging device 1 of FIG. 46, both the upper side substrate 11D and the lower side substrate 11E are formed as the back side illumination types, in a similar manner to the configuration of FIG. 42 of the third embodiment.

Effects of Third and Fourth Embodiments

Figures 47A, 47B:
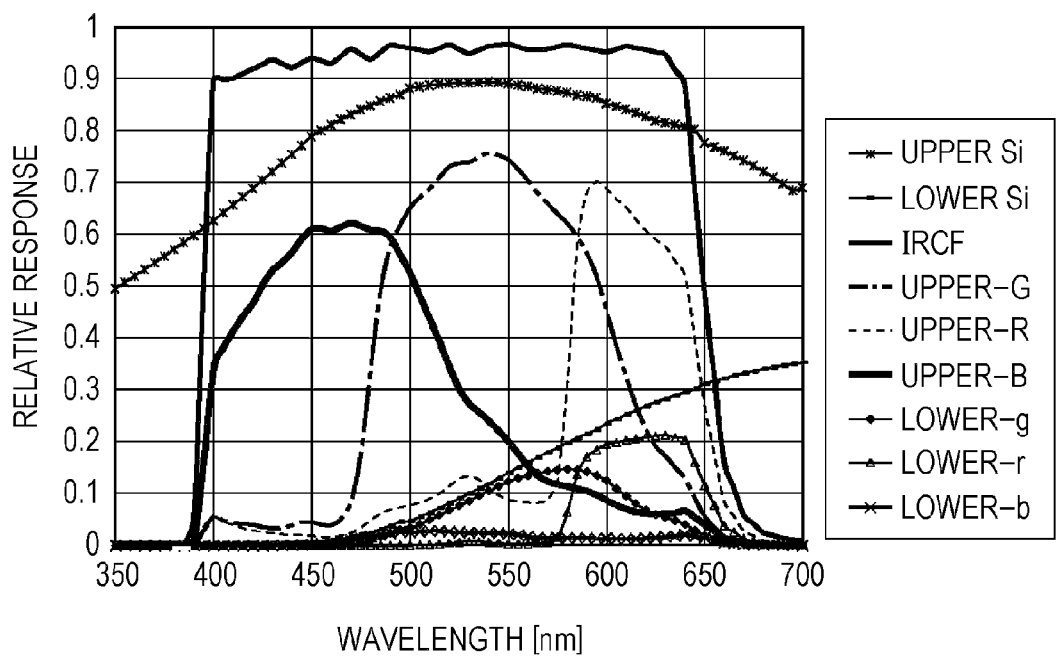
FIGS. 47A and 47B are diagrams illustrating a light reception sensitivity of the solid-state imaging device of the third embodiment.

FIGS. 47A and 47B show the light reception sensitivity of the solid-state imaging device 1 at a standard thickness where the standard thickness is a thickness of the silicon layer 51 in the above-mentioned third embodiment.

FIG. 47A shows spectroscopic properties of the light which is incident on the upper side substrate 11D and the lower side substrate 11E at the standard thickness, similarly to FIGS. 5 and 6.

FIG. 47B shows integral sensitivities (relative sensitivities) of the R, G, and B pixels of the upper side substrate 11D and the lower side substrate 11E at the standard thickness. For example, in the case of the R pixels of the upper side substrate 11D, the integral sensitivity thereof corresponds to an area which is obtained by integrating the curve shown in Upper-R of FIG. 47A.

As shown in FIG. 47B, the integral sensitivities of the R and G pixels of the lower side substrate 11E are about 3[%], and a ratio thereof to the integral sensitivity of the R pixels of the upper side substrate 11D is about 15% ($=(3/19) \times 100$).

It seems that the integral sensitivities of the R and G pixels of the lower side substrate 11E are low. However, as described later, in the third embodiment, an area of the light receiving surface of the lower side substrate 11E is the same as an area of the light receiving surface of the upper side substrate 11D. Accordingly, it may be said that the integral sensitivities are large enough for the light reception sensitivities which are obtained by the entire lower side substrate 11E.

Compared with a method of separating the incident light by the sub mirror so as to generate a phase difference signal by the phase-difference-only sensor provided separately from the image sensor, the light reception sensitivity of the phase difference sensor of the lower side substrate 11E in the third embodiment will be described.

Figure 48:
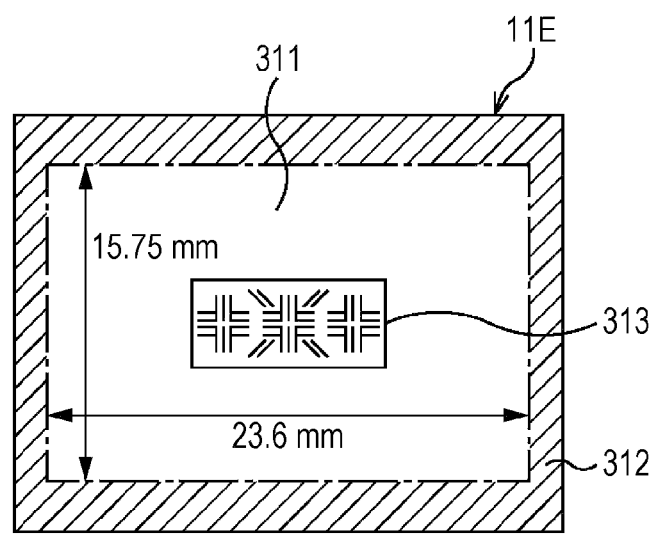
FIG. 48 is a diagram comparatively illustrating signal amounts of phase-difference-only sensors.

FIG. 48 shows a light receiving region 311 and a circuit region 312 of the lower side substrate 11E having one chip size. For example, when the solid-state imaging device 1 has an APS-C size, the size of the light receiving region 311 is about 15.75 mm×23.6 mm.

Further, for comparison, FIG. 48 also shows a phase-difference-only sensor region 313 having the APS-C size, in a case of the method of generating the phase difference signal by the phase-difference-only sensor provided separately from the image sensor.

As can be seen from FIG. 48, an area of the light receiving region 311 of the lower side substrate 11E for performing the phase difference detection is about 9 times an area of the phase-difference-only sensor region 313.

Accordingly, even when the amount of the light incident on the lower side substrate 11E is about 15% of that of the upper side substrate 11D, in the entire light receiving region 311 of the lower side substrate 11E, it is possible to obtain a sensitivity of about 135%=9 times 15%.

As described above, the thickness of the silicon layer 51 of the upper side substrate 11D is set as the standard thickness. In this case, even when the photodiodes 52 are also provided in the transmission pixels of the upper side substrate 11D and the light transmitted through the photodiodes 52 is made to be incident on the lower side substrate 11E, it is possible to precisely perform the phase difference detection.

Next, the effects of thinning of the silicon layer 51 of the upper side substrate 11D in the fourth embodiment will be described.

Figures 49A, 49B:
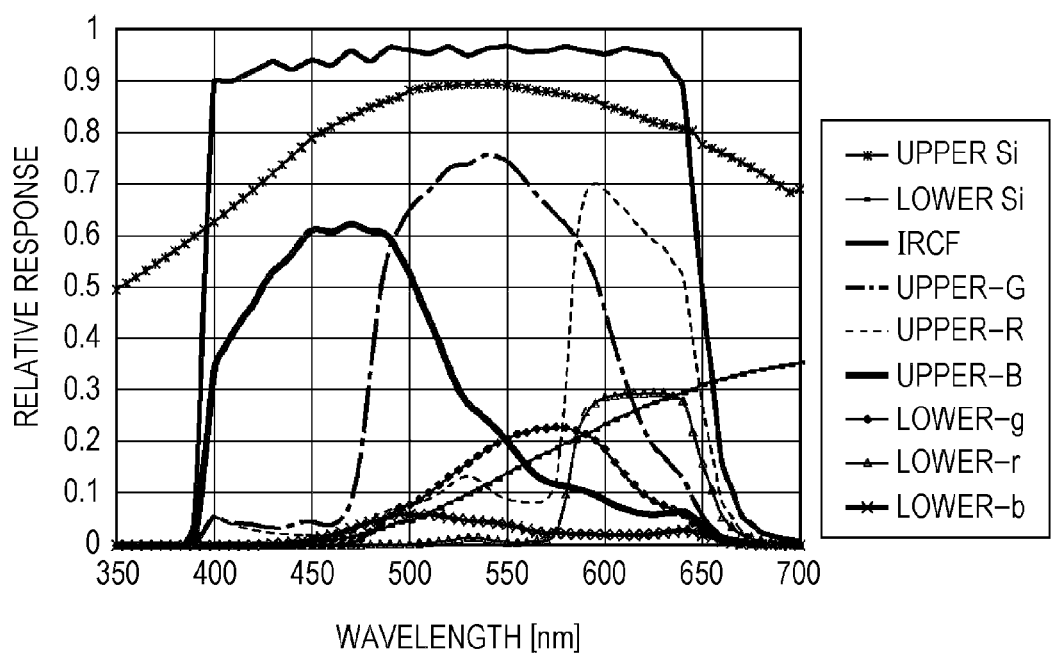
FIGS. 49A and 49B are diagrams illustrating a light reception sensitivity of the solid-state imaging device of the fourth embodiment.

FIGS. 49A and 49B show light reception sensitivities of the solid-state imaging device 1, in which the silicon layer 51 of the upper side substrate 11D is formed to be thin, according to the fourth embodiment.

In addition, FIGS. 49A and 49B show an example in which the silicon layer 51 of the upper side substrate 11D is formed to be thinner by about 25% than the standard thickness of the third embodiment.

FIG. 49A shows spectroscopic properties of the light which is incident on the upper side substrate 11D and the lower side substrate 11E when the silicon layer 51 of the upper side substrate 11D is formed to be thinner by about 25%.

FIG. 49B shows integral sensitivities (relative sensitivities) of the R, G, and B pixels of the upper side substrate 11D and the lower side substrate 11E when the silicon layer 51 of the upper side substrate 11D is formed to be thinner by about 25%.

By thinning the silicon layer 51 by about 25%, the integral sensitivities of the R, G, and B pixels of the upper side substrate 11D are lowered compared with the case where the silicon layer 51 has the standard thickness. For example, compared with the G pixels, the integral sensitivity, which is obtained when the silicon layer 51 is formed to be thinner by about 25%, is represented by (17.1/19.1)×100=89.52 . . . , and becomes lower by about 10% than that at the standard thickness.

On the other hand, by thinning the silicon layer 51 by about 25%, the integral sensitivities of the R, G, and B pixels of the lower side substrate 11E become larger than that at the standard thickness. For example, compared with the R pixels, the integral sensitivity, which is obtained when the silicon layer 51 is formed to be thinner by about 25%, is represented by (4.26/2.96)×100=143.91 . . . , and becomes larger by about 44% than that at the standard thickness. A ratio of the integral sensitivity of the R pixels of the lower side substrate 11E to that of the G pixels of the upper side substrate 11D is (4.26/17.1)×100=24.91 . . . , and reaches about 25%.

As described above, by thinning the silicon layer 51 by about 25%, compared with the deterioration in the light reception sensitivity of each pixel 21A of the upper side substrate 11D, the light reception sensitivity of each pixel 21B of the lower side substrate 11E is greatly improved. By adjusting the thickness of the silicon layer 51 of the upper side substrate 11D, it is possible to control the amount of light incident on the pixels 21B of the lower side substrate 11E.

That is, according to the solid-state imaging device 1 of the fourth embodiment, while minimizing loss in the sensitivity of each pixel of the upper side substrate 11D, it is possible to use all the pixels as the imaging sensor. Further, it is possible to precisely perform the phase difference detection in the lower side substrate 11E.

Configuration Examples of Multilayer Structure

Figure 50A:
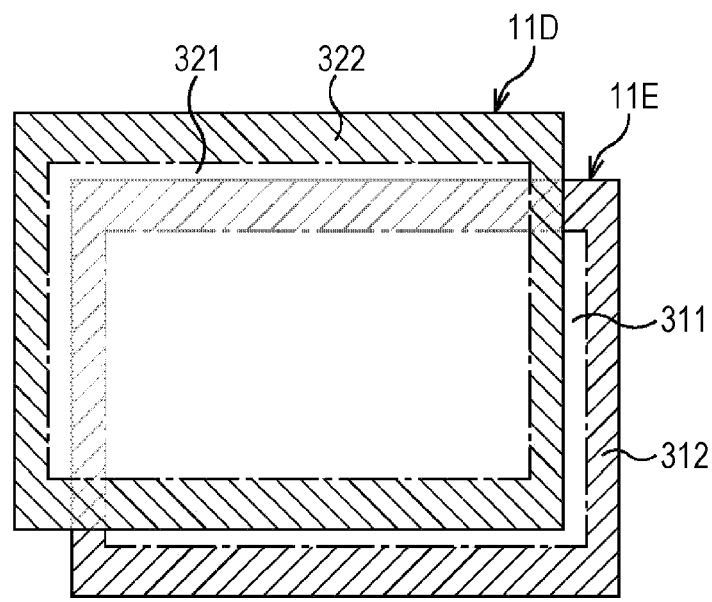
FIGS. 50A and 50B are diagrams illustrating configuration examples of circuit arrangement of a solid-state imaging device of a 2-layer laminated structure.
Figure 50B:
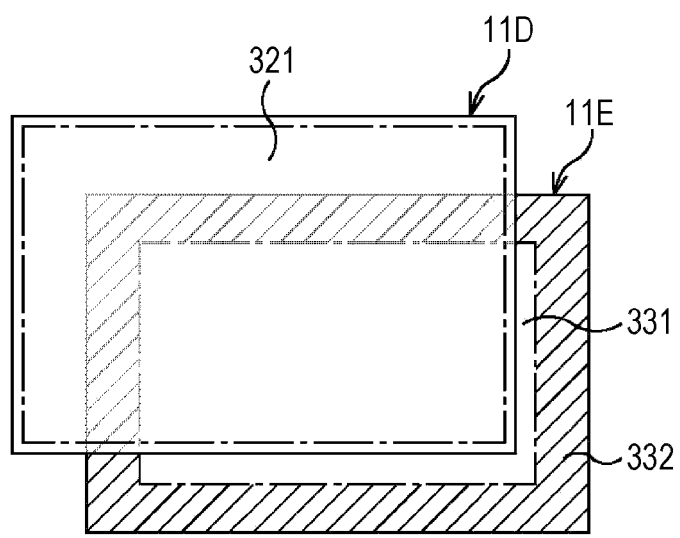

FIGS. 50A and 50B show configuration examples of circuit arrangement of the substrates 11 in a case where the solid-state imaging device 1 is configured to have a 2-layer structure of the upper side substrate 11D and the lower side substrate 11E.

FIG. 50A shows a configuration example of circuit arrangement. In the example, a light receiving region 321 of the upper side substrate 11D and a light receiving region 311 of the lower side substrate 11E have the same sizes, and a coverage ratio of the phase difference sensor region of the lower side substrate 11E to the light receiving region 321 of the upper side substrate 11D is set to 100%.

In this case, a circuit region 322 of the upper side substrate 11D has the same size as a circuit region 312 of the lower side substrate 11E.

FIG. 50B shows a configuration example of circuit arrangement of the substrates 11 of the solid-state imaging device 1 in the case of the 2-layer structure in which a size of one chip is made to be as small as possible without deterioration in the light reception sensitivity of the image sensor.

Only the light receiving region 321 is formed on the upper side substrate 11D.

Meanwhile, a light receiving region 331 as a phase difference sensor region and a circuit region 332 are formed on the lower side substrate 11E. The respective circuits of the circuit region 322 of the upper side substrate 11D and the circuit region 312 of the lower side substrate 11E of FIG. 50A are disposed to be integrated in the circuit region 332. Hence, a size of the circuit region 332 is greater than a size of the circuit region 312 of the lower side substrate 11E in FIG. 50A. However, as a coverage ratio of the phase difference sensor region of the lower side substrate 11E to the light receiving region 321 of the upper side substrate 11D, it is possible to ensure at least 80%.

Figure 51:
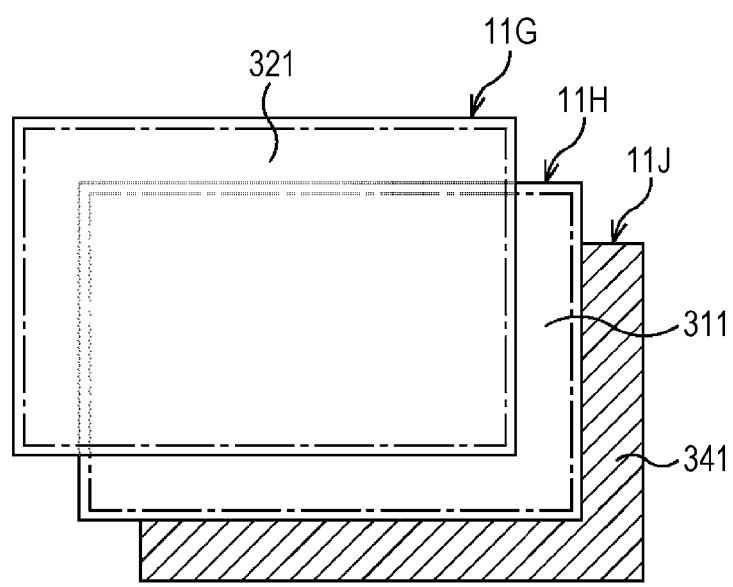
FIG. 51 is a diagram illustrating a configuration example of circuit arrangement of a solid-state imaging device of a 3-layer laminated structure.

FIG. 51 shows a configuration example of circuit arrangement of the substrates 11 in a case where the solid-state imaging device 1 is configured to have a multilayer structure of three substrates 11.

Only the light receiving region 321 is formed on an upper side substrate 11G which is an uppermost layer of the 3-layer structure. A light receiving region 311 is formed on an intermediate substrate 11H which is an intermediate layer. The light receiving region 311 has the same size as the light receiving region 321, and is formed such that a coverage ratio of the phase difference sensor region of the intermediate substrate 11H to the light receiving region 321 of the upper side substrate 11G is 100%.

A circuit region 341 is formed on a lower side substrate 11J which is a lowermost layer of the 3-layer structure.

As described above, by forming the solid-state imaging device 1 as the 3-layer structure, for example, it is possible to make a chip size thereof have the same size as APS-C and make the chip size smaller than the solid-state imaging device 1 having the 2-layer laminated structure of FIG. 50A. Further, it is possible to ensure a greater coverage ratio of the phase difference sensor region than that of the solid-state imaging device 1 having the 2-layer laminated structure of FIG. 50B.

Further, the whole of the lower side substrate 11J as the lowermost layer is used as the circuit region 341. Therefore, not only the driving circuit, which drives the pixels of the light receiving region 311 of the intermediate substrate 11H and the light receiving region 321 of the upper side substrate 11G, but also an analog-digital converter (ADC), a logic circuit, a memory, and the like can be disposed in the circuit region 341 of the lower side substrate 11J.

Furthermore, when the circuits are disposed on the lower side substrate 11J of the lowermost layer so as to process signal processing of the image sensor of the uppermost layer and signal processing of the phase difference sensor of the intermediate layer in parallel, it is possible to improve a speed of detection of the phase difference autofocus.

Figure 52:
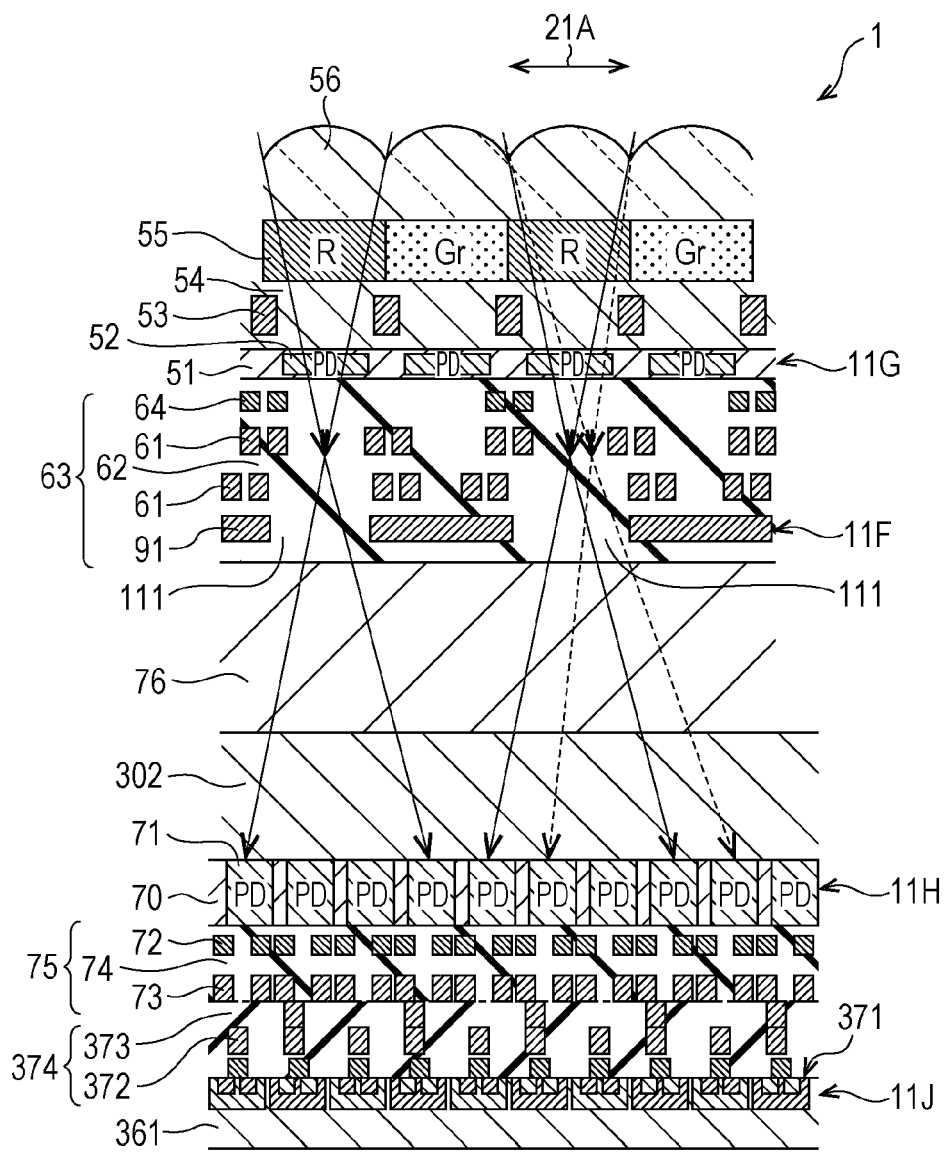
FIG. 52 is a cross-sectional configuration diagram of the solid-state imaging device of the 3-layer laminated structure.

FIG. 52 shows a cross-sectional configuration diagram of the solid-state imaging device 1 in a case where the solid-state imaging device 1 is configured to have a multilayer structure of three substrates 11.

The upper side substrate 11G and the intermediate substrate 11H correspond to the upper side substrate 11D and the lower side substrate 11E of the solid-state imaging device 1 of the 2-layer laminated structure of FIG. 46, and a description thereof will be omitted. Both the upper side substrate 11G and the intermediate substrate 11H are bonded to be the back side illumination types.

Then, the multilevel wiring layer 75 of the intermediate substrate 11H and a multilevel wiring layer 374 of the lower side substrate 11J are bonded through, for example, metallic bonding of Cu—Cu. The multilevel wiring layer 374 is formed of one or more wiring layers 372 and an interlayer insulation film 373.

Signal processing circuits including a plurality of transistors 371 are formed on a silicon layer 361 of the lower side substrate 11J.

5. Application Example of Electronic Apparatus

The above-mentioned solid-state imaging device 1 can be applied to various electronic apparatuses of, for example, an imaging apparatus such as a digital still camera or a digital video camera, a mobile phone having an imaging function, and an audio player having an imaging function.

Figure 53:
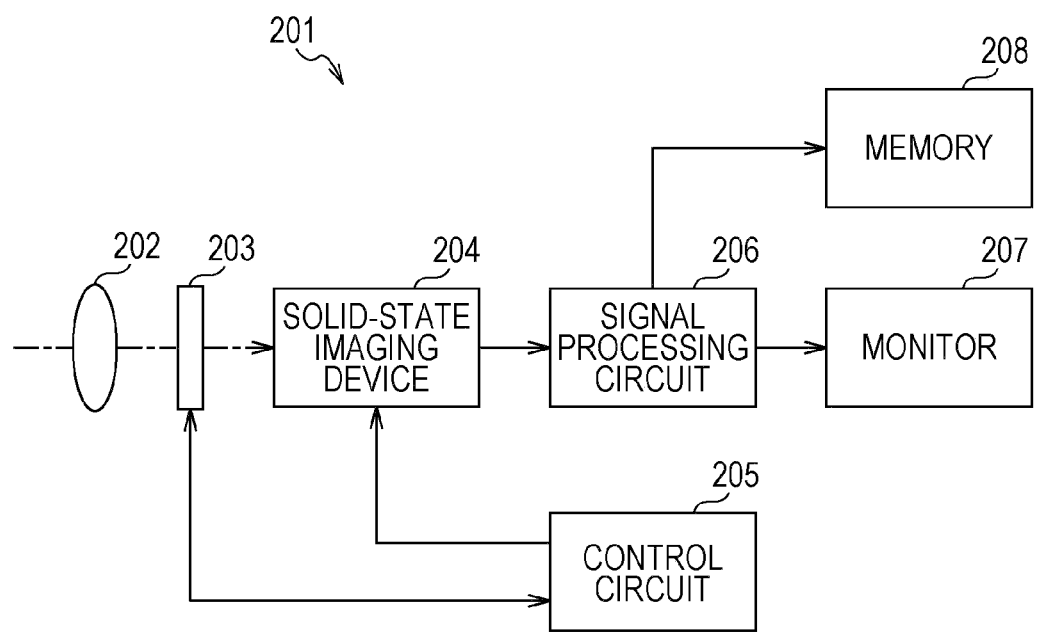
FIG. 53 is a block diagram illustrating a configuration example of an imaging apparatus as an electronic apparatus according to an embodiment of the present disclosure.

FIG. 53 is a block diagram illustrating a configuration example of an imaging apparatus as an electronic apparatus according to an embodiment of the present disclosure.

An imaging apparatus 201 shown in FIG. 53 includes an optical system 202, a shutter apparatus 203, a solid-state imaging device 204, a control circuit 205, a signal processing circuit 206, a monitor 207, and a memory 208, and is able to capture a still image and a moving image.

The optical system 202 is formed of a single lens or a plurality of lenses, guides light (incident light), which originates from an object, into the solid-state imaging device 204, and forms an image on the light receiving surface of the solid-state imaging device 204.

The shutter apparatus 203 is disposed between the optical system 202 and the solid-state imaging device 204, and controls a period of illumination of light and a period of blocking of light onto the solid-state imaging device 204, under the control of the control circuit 205.

The solid-state imaging device 204 is formed by the above-mentioned solid-state imaging device 1. The solid-state imaging device 204 accumulates signal charge, for a certain period of time, in response to light which is imaged on the light receiving surface through the optical system 202 and the shutter apparatus 203. The signal charge accumulated in the solid-state imaging device 204 is transmitted in accordance with a driving signal (timing signal) which is supplied from the control circuit 205. The solid-state imaging device 204 may be formed as a single chip by itself, and may be formed as a part of a camera module which is packaged together with the optical system 202, the signal processing circuit 206, and the like.

The control circuit 205 outputs driving signals for controlling a transmission operation of the solid-state imaging device 204 and a shutter operation of the shutter apparatus 203, and drives the solid-state imaging device 204 and the shutter apparatus 203.

The signal processing circuit 206 applies various kinds of signal processing to the pixel signal which is output from the solid-state imaging device 204. An image (image data), which is obtained by the signal processing circuit 206 applying the signal processing, is supplied to and displayed on the monitor 207, and is supplied to and stored (recorded) in the memory 208.

By using the solid-state imaging device 1 according to the above-mentioned embodiments as the solid-state imaging device 204, it is possible to perform high speed and high precision autofocus and auto exposure. Accordingly, it is possible to achieve high image quality of a captured image also in the imaging apparatus 201 such as a video camera, a digital still camera, and a camera module for mobile apparatuses of a mobile phone and the like.

The embodiments of the present disclosure are not limited to the above-mentioned embodiments, and may be modified into various forms without departing from the technical scope of the present disclosure.

In the above-mentioned examples, the description was given of the solid-state imaging device in which electrons are used as signal charge when the first conductive type is the P type and the second conductive type is the N type. However, the technology of the present disclosure can also be applied to a solid-state imaging device in which holes are used as signal charge. That is, when the first conductive type is the N type and the second conductive type is the P type, each above-mentioned semiconductor region can be formed as a semiconductor region having an inverse conductive type.

Further, the technology of the present disclosure is not limited to being applied to the solid-state imaging device that detects distribution of the amount of incident visible light and captures the distribution as an image. The technology can be applied to most solid-state imaging devices, which capture an image of distribution of the amount of incidence of infrared rays, X rays, or particles, and solid-state imaging devices (physical amount distribution detection devices) such as a fingerprint detection sensor which detects distributions of other physical amounts such as a pressure and a capacitance and captures the distributions as images in a wider sense.

The embodiments of the present disclosure are not limited to the above-mentioned embodiments, and may be modified into various forms without departing from the technical scope of the present disclosure.

For example, it is possible to employ a combination form of all or a part of the above-mentioned plurality of embodiments.

It should be noted that the effects described in the present specification are just examples, and are not limited, and there may be other effects other than the description of the present specification.

It should be noted that the present disclosure may adopt the following configurations.

(1)

A solid-state imaging device including two or more photoelectric conversion layers that have photoelectric conversion portions divided on a pixel-by-pixel basis and are laminated, in which light, which is incident into a single pixel of a first photoelectric conversion layer close to an optical lens, is received by the photoelectric conversion portions of a plurality of pixels of a second photoelectric conversion layer far from the optical lens.

(2)

The solid-state imaging device according to (1), in which focus control is performed by using a contrast difference between a signal, which is obtained by the first photoelectric conversion layer, and a signal, which is obtained by the second photoelectric conversion layer.

(3)

The solid-state imaging device according to (1) or (2), in which the signal, which is obtained by the first photoelectric conversion layer, is a color image signal, and the signal, which is obtained by the second photoelectric conversion layer, is a monochrome image signal.

(4)

The solid-state imaging device according to any one of (1) to (3), in which a pixel size of a single pixel of the second photoelectric conversion layer is equal to a pitch of repetition of a color filter array of the first photoelectric conversion layer.

(5)

The solid-state imaging device according to any one of (1) to (4), in which pixels, which detect the signal in the second photoelectric conversion layer, are predetermined color pixels of the first photoelectric conversion layer.

(6)

The solid-state imaging device according to any one of (1) to (5), further including an intermediate layer that has different transmittances in accordance with colors of color filters of pixels of the first photoelectric conversion layer, and is interposed between the first photoelectric conversion layer and the second photoelectric conversion layer.

(7)

The solid-state imaging device according to (6), in which only pixels of red and blue color filters of the intermediate layer transmit light to the second photoelectric conversion layer.

(8)

The solid-state imaging device according to any one of (2) to (7), in which a contrast difference of at least one of the signal, which is obtained by the first photoelectric conversion layer, and the signal, which is obtained by the second photoelectric conversion layer, is calculated using a signal which is obtained by performing weighted addition on signals of a plurality of pixels.

(9)

The solid-state imaging device according to any one of (2) to (8), in which the pixels includes pixels which detect a phase difference.

(10)

The solid-state imaging device according to (9), in which the pixels which detect the phase difference are pixels of the first photoelectric conversion layer.

(11)

The solid-state imaging device according to (9), in which pixels, which detect the contrast difference, and the pixels, which detect the phase difference, are divided on a row-by-row basis.

(12)

The solid-state imaging device according to (9), in which pixels, which detect the contrast difference, and the pixels, which detect the phase difference, are divided for each color of color filters.

(13)

The solid-state imaging device according to (12), in which the pixels, which detect the phase difference, are green pixels.

(14)

The solid-state imaging device according to (1), in which the plurality of pixels of the second photoelectric conversion layer includes at least pixels which detect the phase difference, and in which focus control is performed by using the phase difference.

(15)

The solid-state imaging device according to (14), in which a plurality of pixels of the first photoelectric conversion layer includes pixels, which transmit the light to the second photoelectric conversion layer, and pixels which do not transmit the light to the second photoelectric conversion layer.

(16)

The solid-state imaging device according to (14) or (15), in which the light, which passes through an on-chip lens and color filters, is incident on the pixels which transmit the light to the second photoelectric conversion layer.

(17)

The solid-state imaging device according to (14) or (16), in which instead of the photoelectric conversion portions, a layer, which does not absorb light, is formed on the pixels of the first photoelectric conversion layer which transmit the light to the second photoelectric conversion layer.

(18)

The solid-state imaging device according to any one of (14) to (17), in which the light, which is incident into the single pixel of the first photoelectric conversion layer, is received by the photoelectric conversion portions of three or more pixels of the second photoelectric conversion layer in horizontal and vertical directions.

(19)
The solid-state imaging device according to any one of (14) to (18), further including a light blocking layer, which does not transmit the light to the second photoelectric conversion layer.

(20)
The solid-state imaging device according to (19), in which the light blocking layer is a wiring layer.

(21)
The solid-state imaging device according to (19), in which the light blocking layer is a glass layer on which a pattern is deposited.

(22)
The solid-state imaging device according to any one of (1) to (21), in which a position of a transistor circuit, which reads a signal obtained by the first photoelectric conversion layer, is different from a position of a transistor circuit, which reads a signal obtained by the second photoelectric conversion layer, in a planar direction.

(23)
The solid-state imaging device according to any one of (1) to (22), in which the plurality of pixels of the second photoelectric conversion layer further includes pixels which control exposure.

(24)
The solid-state imaging device according to any one of (1) to (23), in which a color filter array of the first photoelectric conversion layer is a Bayer array.

(25)
The solid-state imaging device according to any one of (1) to (24), in which pixel rows of the second photoelectric conversion layer are arranged to correspond to only some of pixel rows of the first photoelectric conversion layer.

(26)
The solid-state imaging device according to any one of (1) to (25), further including a transparent intermediate layer that is interposed between the first photoelectric conversion layer and the second photoelectric conversion layer.

(27)
The solid-state imaging device according to any one of (1) to (26), in which a logic circuit is also formed on a substrate on which the second photoelectric conversion layer is formed.

(28)
The solid-state imaging device according to any one of (1) to (27), in which a substrate, on which the second photoelectric conversion layer is formed, is a back side illumination type.

(29)
The solid-state imaging device according to any one of (1) to (28), in which a substrate, on which the second photoelectric conversion layer is formed, is disposed on a side opposite to a side of the optical lens, and is bonded to a substrate on which a circuit is formed.

(30)
An electronic apparatus including a solid-state imaging device in which two or more photoelectric conversion layers having photoelectric conversion portions divided on a pixel-by-pixel basis are laminated,
in which light, which is incident into a single pixel of a first photoelectric conversion layer close to an optical lens, is received by the photoelectric conversion portions of a plurality of pixels of a second photoelectric conversion layer far from the optical lens.

(31)
A solid-state imaging device including:
a semiconductor substrate that has a signal processing circuit formed thereon and is laminated; and
a photoelectric conversion layer that has photoelectric conversion portions divided on a pixel-by-pixel basis and is laminated,
in which the semiconductor substrate has a transmission pixel which corresponds to a single pixel of the photoelectric conversion layer and transmits light to the photoelectric conversion layer, and
in which the light, which is incident into the transmission pixel of the semiconductor substrate, is received by the photoelectric conversion portions of a plurality of pixels of the photoelectric conversion layer, and focus control is performed by using a phase difference which is obtained by the plurality of pixels of the photoelectric conversion layer.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising two or more photoelectric conversion layers that have photoelectric conversion portions divided on a pixel-by-pixel basis and are laminated,
    wherein light, which is incident into a single pixel of a first photoelectric conversion layer close to an optical lens, is received by the photoelectric conversion portions of a plurality of pixels of a second photoelectric conversion layer far from the optical lens, and
    wherein focus control is performed by using a contrast difference between a signal, which is obtained by the first photoelectric conversion layer, and a signal, which is obtained by the second photoelectric conversion layer.

2. The solid-state imaging device according to claim 1, wherein the signal, which is obtained by the first photoelectric conversion layer, is a color image signal, and the signal, which is obtained by the second photoelectric conversion layer, is a monochrome image signal.

3. The solid-state imaging device according to claim 1, wherein a pixel size of a single pixel of the second photoelectric conversion layer is equal to a pitch of repetition of a color filter array of the first photoelectric conversion layer.

4. The solid-state imaging device according to claim 1, wherein pixels, which detect the signal in the second photoelectric conversion layer, are predetermined color pixels of the first photoelectric conversion layer.

5. The solid-state imaging device according to claim 1, further comprising an intermediate layer that has different transmittances in accordance with colors of color filters of pixels of the first photoelectric conversion layer, and is interposed between the first photoelectric conversion layer and the second photoelectric conversion layer.

6. The solid-state imaging device according to claim 5, wherein only pixels of red and blue color filters of the intermediate layer transmit light to the second photoelectric conversion layer.

7. The solid-state imaging device according to claim 1, wherein a contrast difference of at least one of the signal, which is obtained by the first photoelectric conversion layer, and the signal, which is obtained by the second photoelectric conversion layer, is calculated using a signal which is obtained by performing weighted addition on signals of a plurality of pixels.

8. The solid-state imaging device according to claim 1, wherein the pixels includes pixels which detect a phase difference.

9. The solid-state imaging device according to claim 8, wherein the pixels which detect the phase difference are pixels of the first photoelectric conversion layer.

10. The solid-state imaging device according to claim 8, wherein pixels, which detect the contrast difference, and the pixels, which detect the phase difference, are divided on a row-by-row basis.

11. The solid-state imaging device according to claim 8, wherein pixels, which detect the contrast difference, and the pixels, which detect the phase difference, are divided for each color of color filters.

12. The solid-state imaging device according to claim 11, wherein the pixels, which detect the phase difference, are green pixels.

13. The solid-state imaging device according to claim 1, wherein a position of a transistor circuit, which reads a signal obtained by the first photoelectric conversion layer, is different from a position of a transistor circuit, which reads a signal obtained by the second photoelectric conversion layer, in a planar direction.

14. The solid-state imaging device according to claim 1, wherein the plurality of pixels of the second photoelectric conversion layer further includes pixels which control exposure.

15. The solid-state imaging device according to claim 1, wherein a color filter array of the first photoelectric conversion layer is a Bayer array.

16. The solid-state imaging device according to claim 1, wherein pixel rows of the second photoelectric conversion layer are arranged to correspond to only some of pixel rows of the first photoelectric conversion layer.

17. The solid-state imaging device according to claim 1, further comprising a transparent intermediate layer that is interposed between the first photoelectric conversion layer and the second photoelectric conversion layer.

18. The solid-state imaging device according to claim 1, wherein a logic circuit is also formed on a substrate on which the second photoelectric conversion layer is formed.

19. The solid-state imaging device according to claim 1, wherein a substrate, on which the second photoelectric conversion layer is formed, is a back side illumination type.

20. The solid-state imaging device according to claim 1, wherein a substrate, on which the second photoelectric conversion layer is formed, is disposed on a side opposite to a side of the optical lens, and is bonded to a substrate on which a circuit is formed.

21. An electronic apparatus comprising a solid-state imaging device in which two or more photoelectric conversion layers having photoelectric conversion portions divided on a pixel-by-pixel basis are laminated, wherein light, which is incident into a single pixel of a first photoelectric conversion layer close to an optical lens, is received by the photoelectric conversion portions of a plurality of pixels of a second photoelectric conversion layer far from the optical lens, and wherein focus control is performed by using a contrast difference between a signal, which is obtained by the first photoelectric conversion layer, and a signal, which is obtained by the second photoelectric conversion layer.

22. The electronic apparatus according to claim 21, wherein the signal, which is obtained by the first photoelectric conversion layer, is a color image signal, and the signal, which is obtained by the second photoelectric conversion layer, is a monochrome image signal.

23. The electronic apparatus according to claim 21, wherein a pixel size of a single pixel of the second photoelectric conversion layer is equal to a pitch of repetition of a color filter array of the first photoelectric conversion layer.

24. The electronic apparatus according to claim 21, wherein pixels, which detect the signal in the second photoelectric conversion layer, are predetermined color pixels of the first photoelectric conversion layer.

25. The electronic apparatus according to claim 21, further comprising an intermediate layer that has different transmittances in accordance with colors of color filters of pixels of the first photoelectric conversion layer, and is interposed between the first photoelectric conversion layer and the second photoelectric conversion layer.

26. The electronic apparatus according to claim 25, wherein only pixels of red and blue color filters of the intermediate layer transmit light to the second photoelectric conversion layer.

27. The electronic apparatus according to claim 21, wherein a contrast difference of at least one of the signal, which is obtained by the first photoelectric conversion layer, and the signal, which is obtained by the second photoelectric conversion layer, is calculated using a signal which is obtained by performing weighted addition on signals of a plurality of pixels.

28. The electronic apparatus according to claim 21, wherein the pixels includes pixels which detect a phase difference.

29. The electronic apparatus according to claim 28, wherein the pixels which detect the phase difference are pixels of the first photoelectric conversion layer.

30. The electronic apparatus according to claim 28, wherein pixels, which detect the contrast difference, and the pixels, which detect the phase difference, are divided on a row-by-row basis.

* * * * *